United States Patent van Saders et al.

[19]

[11] Patent Number: 6,005,375
[45] Date of Patent: Dec. 21, 1999

[54] AMPLIFIER USING A SINGLE POLARITY POWER SUPPLY

[76] Inventors: John van Saders, 153 Bloomsbury Rd., Asbury, N.J. 08802; Robert J. Bayruns, 136 Stout Ave., Middlesex, N.J. 08846

[21] Appl. No.: 09/072,860

[22] Filed: May 5, 1998

Related U.S. Application Data

[62] Division of application No. 08/764,350, Dec. 12, 1996
[60] Provisional application No. 60/008,678, Dec. 15, 1995.

[51] Int. Cl.$^6$ .................................................. G05F 1/44
[52] U.S. Cl. .................................................. 323/273
[58] Field of Search .................. 323/265, 273, 323/274, 279, 282, 303, 280, 281, 313; 330/277

[56] References Cited

U.S. PATENT DOCUMENTS

| | | | |
|---|---|---|---|
| 3,571,604 | 3/1971 | La Porta et al. | 307/24 |
| 3,612,984 | 10/1971 | Davis et al. | 323/314 |
| 4,015,609 | 4/1977 | Mensink et al. | 128/419 |
| 4,175,250 | 11/1979 | Morgan | 323/22 |
| 4,176,308 | 11/1979 | Dobkin et al. | 323/314 |
| 4,292,544 | 9/1981 | Ishii et al. | 307/52 |
| 4,417,202 | 11/1983 | Pascoe | 324/51 |
| 4,459,538 | 7/1984 | Arai et al. | 323/275 |
| 4,471,289 | 9/1984 | Duley et al. | 323/222 |
| 4,527,228 | 7/1985 | Yu | 363/98 |
| 4,553,047 | 11/1985 | Dillinger et al. | 307/297 |
| 4,580,065 | 4/1986 | Haque | 307/273 |
| 4,713,631 | 12/1987 | Enderby et al. | 331/36 |
| 4,810,905 | 3/1989 | Graham et al. | 307/448 |
| 4,812,683 | 3/1989 | Fitzpatrick et al. | 307/448 |
| 4,926,071 | 5/1990 | MacMillan et al. | 307/475 |
| 4,926,109 | 5/1990 | Koterasawa | 323/274 |
| 4,933,573 | 6/1990 | Takeda et al. | 307/296.2 |
| 4,994,729 | 2/1991 | Taylor | 323/314 |
| 5,015,921 | 5/1991 | Carlson et al. | 315/208 |
| 5,027,266 | 6/1991 | Ishii et al. | 363/63 |
| 5,050,235 | 9/1991 | Kojima | 455/127 |
| 5,168,174 | 12/1992 | Naso et al. | 307/296.6 |
| 5,182,469 | 1/1993 | Farley et al. | 327/534 |
| 5,235,289 | 8/1993 | Kunitomo | 330/277 |
| 5,247,241 | 9/1993 | Ueda | 323/312 |
| 5,298,808 | 3/1994 | Terrell et al. | 307/475 |
| 5,298,869 | 3/1994 | Jinich et al. | 330/286 |
| 5,300,895 | 4/1994 | Jones | 330/251 |
| 5,327,583 | 7/1994 | Yamada et al. | 455/89 |
| 5,374,899 | 12/1994 | Griffiths et al. | 330/277 |
| 5,408,198 | 4/1995 | Kusunoki | 330/277 |
| 5,532,640 | 7/1996 | Okunage | 327/537 |
| 5,559,423 | 9/1996 | Harman | 323/277 |

*Primary Examiner*—Adolf Berhane

[57] ABSTRACT

The present invention provides a power amplifier operating with a single power supply. The amplifier includes at least one depletion-mode FET for amplifying an ac signal and a negative voltage generator for providing a bias to the FET. Preferably the amplifier further includes a negative voltage regulator to provide a regulated bias to bias the FET for a class A, AB or B operation. The negative generator includes a multivibrator for producing two clock signals and a charge pump which receives the clock signals and produces a negative voltage. Advantageously the negative voltage is provided as a low reference potential to the multivibrator so that the clock signals it produced include a negative voltage period, which enables the charge pump to operate in a power efficient manner.

11 Claims, 18 Drawing Sheets

AMPLIFIER USING A SINGLE POLARITY POWER SUPPLY

This is a division of application Ser. No. 08/764,350 filed Dec. 12, 1996. This application claim the benefit of U.S. Provisional Appln. No. 60/008,678 Dec. 15, 1995.

FIELD OF THE INVENTION

The present invention generally relates to the field of amplifiers and more particularly, amplifiers having depletion-mode field effect transistors and operating with a single polarity power supply.

BACKGROUND OF THE INVENTION

All cellular telephones contain an amplifier for amplifying transmit signal. Because cellular telephones are small in size and preferably contain a single rechargeable battery, the amplifier is preferred to operate with a single polarity power supply. Moreover, it is preferred that the amplifier consumes low power, particularly when the cellular telephones are in a "standby" mode. A cellular telephone is in a "standby mode" when it is able to receive a ring signal indicating an incoming call but cannot send a transmit signal unless it is activated. It is further preferred that the amplifier has high power capability, is durable and can be made at low cost.

Power amplifiers used in cellular phones typically include at least one transistor for signal amplification and a transistor biasing circuit. A known amplifier includes a discrete silicon power transistor such as a silicon bipolar transistor or an enhancement-mode silicon MOSFET, and a transistor biasing circuit which is not monolithically integrated with the power transistor. This amplifier has certain advantages: silicon technology is well understood and well developed; silicon power transistors are readily available; a discrete silicon transistor can be individually optimized for power or efficiency. It however suffers the following drawbacks.

First, as compared with GaAs transistors, silicon transistors are generally slower in speed and have lower power capability. Second, it is difficult to monolithically integrate a silicon power transistor with its biasing circuit, because a silicon integrated circuit ("IC") has large parasitics especially at high frequencies. The large parasitics are caused by the pn junctions used in a silicon ICs for device isolation. In comparison, device isolation in a GaAs IC is typically accomplished by simply forming each device on a mesa on a semi-insulating substrate, which results in lower parasitics.

Further, because of its lower electron mobility and velocity, silicon transistors need to be optimized for power. The optimized transistors generally have structures not compatible for monolithic integration. Consequently, a silicon power transistor used in a power amplifier is normally a discrete device, which results in increased assembly cost and reduced reliability.

GaAs based transistors are more preferable than silicon transistors for use in amplifiers because they provides higher power and are capable of operating at higher frequencies. Moreover, they can be monolithically integrated with a GaAs biasing circuit. Among GaAs field effect transistors ("FETs"), depletion-mode GaAs FETs are most suitable for cellular communications because they provide higher power and operate at higher frequencies than enhancement-mode GaAs FETs.

To bias a depletion-mode GaAs FET at a desired operating point, a negative bias must be applied between the gate and source of the FET. The amplitude of this bias depends on the particular application the amplifier is intended. For a class A amplifier, the FET is biased at one half of its zero-bias saturation current, $I_{dss}$; the FET conducts current for an entire input cycle and consumes power continuously. For a class AB amplifier, however, the depletion-mode FET is biased at one quarter of $I_{dss}$ so that the FET is "slightly on" when there is no input signal. For a Class B amplifier, which typically include two depletion-mode FETs arranged in a push-pull fashion such that only one of the FETs is turned on during any half cycle of an input sinusoidal RF signal, the two FETs are biased at pinch-off.

In addition to the negative bias, a depletion FET also requires a positive bias between its drain and source. Thus, a depletion-mode FET requires two biases to operate, a positive bias between the drain and source, and a negative bias between the gate and source. For a typical depletion-mode GaAs MESFET, the positive bias required is about 3 to 12 volts, and the negative bias is about −0.5 to −4 volts. To provide the positive and negative biases, one may use two power supplies, one for the positive bias and the other for the negative bias. It is preferred, however, to use only a single polarity power supply.

There are several known power amplifiers which operate with a single polarity power supply. FIG. 1 depicts a self-biased GaAs amplifier containing a depletion mode GaAs FET 10. The drain of the FET is connected to a positive dc voltage supply, $+V_{DD}$, through an inductor 15; the source is connected to ground through a resistor 20; the gate is dc biased to ground through an inductor 25. A capacitor 30 is connected in parallel to resistor 20 for providing an ac path from the source to ground. An input ac signal is provided at the gate of the FET.

In this amplifier, resistor 20 operates to establish a negative bias between the gate and the source. More specifically, because the gate is grounded through inductor 25 and the source is at a positive potential which equals to the voltage on resistor 20, the gate is biased at a potential that is negative with respect to the source. The amplitude of the negative bias approximately equals to the voltage on resistor 20.

This self-biased amplifier is not suitable for cellular communications because, under high power and high frequency conditions, the impedance of inductor 25 and capacitor 30 are no longer negligible. As a result, the amplitude of the negative bias is affected by the input signal. Moreover, the source of the FET is required to directly connect to ground for high frequency operations, a topology not available in this amplifier.

An improved self-biased amplifier is described in U.S. Pat. No. 5,374,899 to Griffiths et al. As depicted in FIG. 2, this amplifier includes, in addition to capacitor 20 and resistor 30, a diode 35 connected in parallel to the resistor. With increased input ac signal, the diode becomes more conductive and consequently, the variation of the source voltage is reduced. Although this circuit appears to have improved power and gain operation over the conventional self-biased amplifier, it remains a disadvantage that the source of the FET is not directly connected to ground.

Referring to FIG. 3, another known amplifier uses a portion of the input ac signal rectified by a rectifier 36 to generate a negative bias. The rectifier consists of a diode 37, a resistor 38 and a pair of capacitors. A major drawback of this amplifier is that in order to generate the negative voltage, it consumes a portion of the input RF signal, thus diminishing the already precious RF source signal. Another problem is that the rectifier generates a relatively stable negative voltage only when the input RF signal is an analog signal. When the input RF signal is digital, the amplitude of the negative voltage varies and it depends on the density of transmit data.

U.S. Pat. No. 5,327,583 to Yamada et al. describes generating a negative bias using a clock signal of a microcomputer. As depicted in FIG. 4, the clock signal is provided from a microprocessor (not shown) to a CMOS invertor and then to a circuit 39 which generates a negative voltage.

We believe this circuit has some significant drawbacks. First, due to process variations in fabricating FETs, the zero-bias saturation current of each FET varies slightly from device to device. As a result, circuit 39 appears to require individually tuning in order to provide a precise negative bias, which requires additional manufacturing steps. Second, this amplifier is not power efficient because one half of the clock signal passes through diode 45 to ground. Further, although circuit 39 includes two capacitors to smooth ripples in the negative bias, we believe that certain amount of ripples still exist, which interferes with input ac signal and causes the noise level to increase. It is preferred that the ripples be reduced.

It is therefore an object of the present invention to provide an amplifier having at least one depletion-mode FET and operating with a single polarity power supply;

it is a further object to provide a negative voltage generator within the power amplifier to generate a negative voltage for biasing the FET;

it is still a further object to make the negative voltage generator power efficient, particularly when the amplifier is in a standby mode;

it is still another object to regulate the negative voltage generated by the negative voltage generator to a desired level before providing it to the depletion-mode FET;

it is another object to reduce the ripples in the negative voltage generated by the negative voltage generator;

it is still a further object to regulate the negative voltage generated by the negative voltage generator and to make it insensitive to small variation in the negative voltage; and it is a further object to make the negative voltage regulator power efficient and particularly when the amplifier is in a stand-by mode.

SUMMARY OF THE INVENTION

Those and other objects are achieved in the present invention which provides a power amplifier operating with a single polarity power supply.

In accordance with the present invention, a amplifier comprises an amplifying stage having at least one depletion-mode FET, and a negative voltage generator providing a negative bias to the FET. The negative voltage generator includes a multivibrator producing two clock signals, and a charge pump which receives the two clock signals and generates a negative voltage. Advantageously, the generated negative voltage is then provided back as a low reference potential to the multivibrator. As a result, the clock signals generated by the multivibrator contain a negative potential period, which enables the charge pump to operate in a power efficient manner.

Preferably, the amplifier further includes a negative voltage regulator which regulates the negative voltage to a value such that it accurately biases the depletion mode FET in the amplifying stage to a desired operating point. No tuning is required to achieve the accurate bias. The negative voltage regulator also operates to smooth the waveform of the negative voltage and to reduce amplitude of ripples present in the negative voltage.

In a preferred embodiment, the multivibrator includes two inverters, each having input and output terminals. A capacitor is coupled between the input terminal of a first inverter to the output terminal of a second inverter. Another capacitor is coupled between the input terminal of the second inverter and the output terminal of the first inverter. Two resistors, one coupled between the input terminal of the first inverter and ground, and the other between the input terminal of the second inverter and the generated negative voltage, are included. The clock signals generated by the multivibrator are inverting signals.

In a more preferred embodiment, the inverters are realized with FETs. More specifically, the first inverter includes an FET with its source connected to ground, its rain connected to a load and to the output terminal of the first inverter, and its gate connected to the input terminal of the first inverter. The second inverter comprises another FET with its source connected to the negative voltage, its drain connected to another load and to the output terminal of the second inverter, and its gate connected to the input terminal of the second inverter. Preferably, the FETs are depletion-mode GaAs FETs, and the two loads are also depletion mode FETs.

In accordance with the present invention, the charge pump comprises four electronic switches, a pump capacitor and a hold capacitor. More specifically, first and second electronic switches are connected in series and between the power supply and ground; second, third and the hold capacitor are connected in series and between ground; the hold capacitor is coupled between the intersection of the first and second switches, and intersection of the third and fourth switches.

The clock signals provided to the charge pump includes two phases: a pump phase and a transfer phase. During the pump phase, the first and third electronic switches which are responsive to the second clock signal, are closed, and the second and fourth electronic switches which are responsive to the first clock signal, are open, thereby charging the pump capacitor. During the transfer phase, however, the first and third electronic switches are open and the second and fourth electronic switches are closed, thereby transferring charges from the pump capacitor to the hold capacitor and in the process, producing a negative voltage across the hold capacitor.

To further improve the power efficiency of the charge pump, when coupling the clock signals to the second switch in the charge pump, the first clock signal is slightly delayed with respect to the second clock signal. This slight delay prevents the first and second switches from being simultaneously closed during the initial moment when the clock signals change from the pump phase to transfer phase, thereby preventing a direct current path from the power supply through the first and second switches to ground. As a result, the power efficiency of the charge pump is improved. In a preferred embodiment, the delay is accomplished by an RC network connected between the first output terminal of the multivibrator and the second switch.

In a preferred embodiment of the charge pump, the electronic switches are realized by four FETs: a first FET with its drain coupled to the power supply, its gate connected to receive the second clock signal; a second FET with its drain coupled to the source of the first FET, its gate connected to receive the first clock signal, and its source coupled to ground; a third FET with its drain coupled to ground, a gate coupled to receive the second clock signal; and a fourth FET with its drain connected to a source of the third FET. Coupled between the source of the first and third FETs is a pump capacitor. A hold capacitor is coupled between the source of the fourth FET and ground. Two capacitors, a first coupled between the gates of the first and third FETs and a second coupled between the gates of the second and fourth FETs, couples the clock singles to the third and fourth FETs. A resistor, coupled between the gate and the source of the fourth FET, bootstraps the FET at the negative voltage which is provided at the source of the fourth FET.

In another preferred embodiment of the charge pump, the switches are realized by two FETs and two diodes: a first FET with its drain coupled to the power supply, its gate connected to receive the second clock signal; a second FET with its drain connected to the source of the first FET, a gate connected to receive the second clock signal, and a source coupled to ground. The cathode of the first diode is coupled to the ground. A second diode has its cathode coupled to the anode of the first diode. The pump capacitor is coupled between the source of the first FET and the anode of the first diode. Coupled between the anode of the second diode and ground is the hold capacitor. The negative voltage is provided across the hold capacitor.

The negative voltage regulator of the present invention utilizes a current mirror. In a preferred embodiment, it comprises a current source and three FETs: a first FET with its drain coupled to the current source and its source connected to ground; a second FET with its drain coupled to the power supply and its gate coupled to the drain of the first FET; a third FET with its drain coupled to the source of the second FET and also to the gate of the first FET. The gate and source of the third FET is connected together and to the negative voltage to be regulated. The regulated negative voltage is provided at the drain of the third FET. The current source can be realized with a resistor or an FET. In a more preferred embodiment, the gate-width of the first FETs is such that the regulator accurately biases the depletion mode FET in the amplifying stage to a desired operating point.

In another preferred embodiment, a negative voltage regulator with improved temperature performance is provided. This regulator is comprised of a current source, and three FETs which are connected as follows: a first FET with its drain coupled to the current source, and its source connected to ground; a second FET with its drain coupled to the power supply, and its gate coupled to the drain of the first FET; a third FET with its drain coupled to the source of the second FET, its gate and source connected together and to the negative voltage to be regulated. The gate of the first FET is resistively coupled to the gate of the depletion mode FET in the amplifying stage. The regulated negative voltage is provided at the drain of the third FET which is resistively coupled to the gate of depletion-mode FET in the amplifying stage.

Advantageously, the coupling between gate of the first FET and the gate of the depletion-mode FET provides a feedback of leakage current at the drain-to-gate junction of the depletion-mode FET. As a result of this feedback, the performance of the regulator under increased temperature is improved.

BRIEF DESCRIPTION OF THE DRAWINGS

Those and other objects, features and advantages of the present invention will be more apparent from the following detailed description in conjunction with the appended drawings in which.

DETAILED DESCRIPTION OF THE INVENTION

The present invention provides an amplifier which includes at least one depletion-mode FET biased by an internally generated negative voltage and which operates with a single polarity power supply.

A "single polarity power supply" is defined herein as a power supply providing only single polarity power. It may include a single power source such as a single battery, and it may include a number of power sources arranged to provide single polarity power. For example, a 12 volt rechargeable battery is a single polarity power supply since it provides a +12 volt power. A power supply including a plurality of batteries arranged to provide +12, +5 and +3 volt power is also a single polarity power supply since it provides only one polarity power. However, a power supply containing two batteries and operating to provide a +5 volt power and a −3 volt power is not a single polarity power supply because the power it provides has two polarities. The amplifier of the present invention requires only a single polarity power supply to operate.

Figure 1:
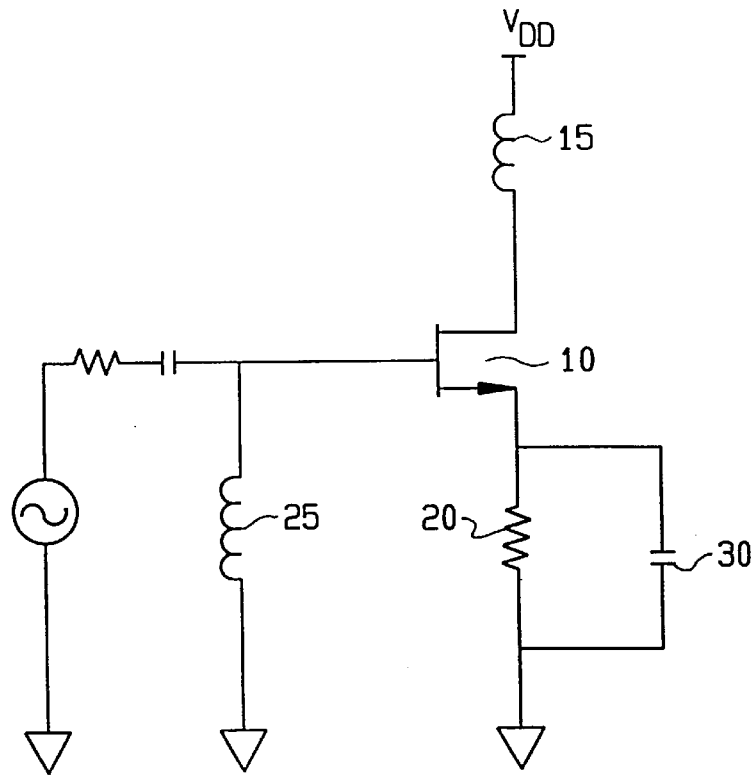
FIGS. 1–4 illustrate prior art GaAs amplifiers.
Figure 2:
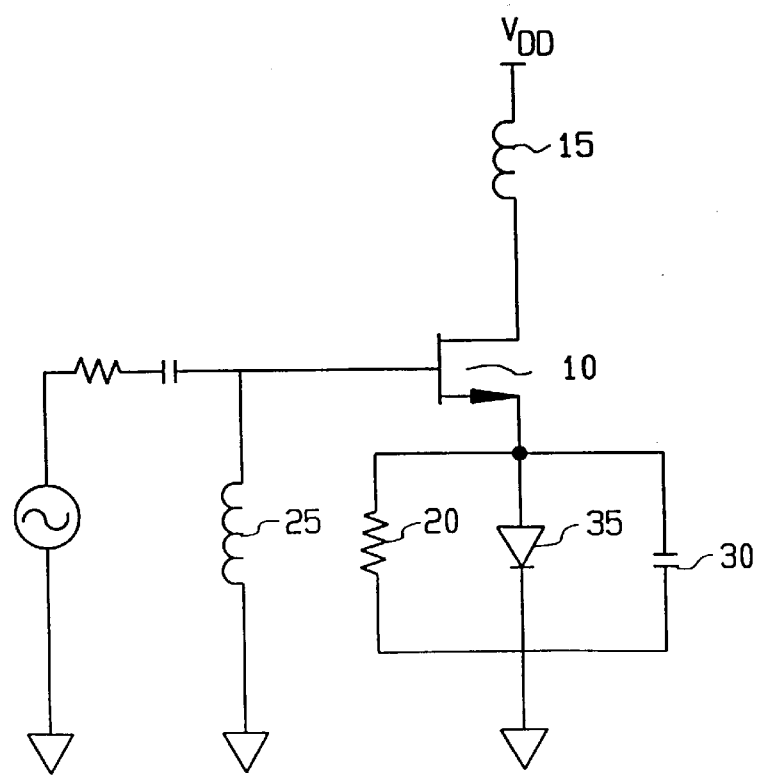
Figure 3:
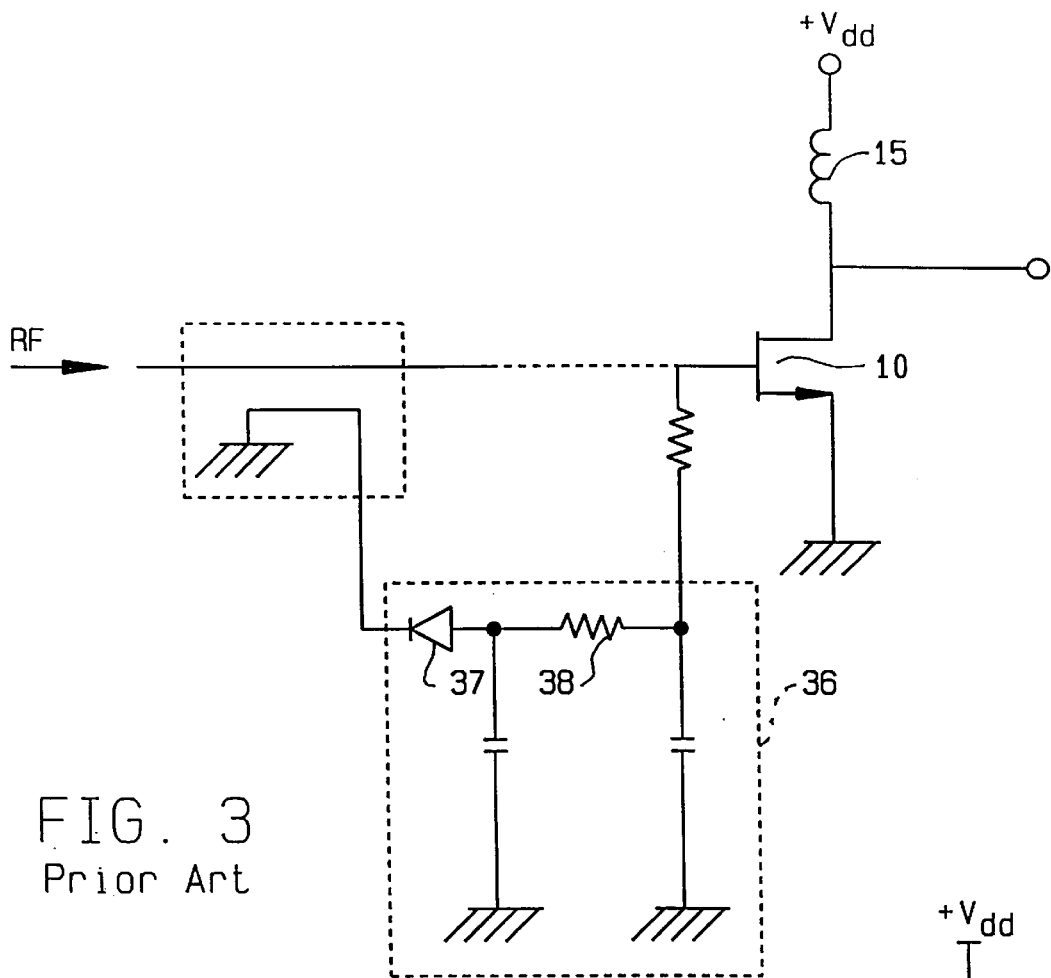
Figure 4:
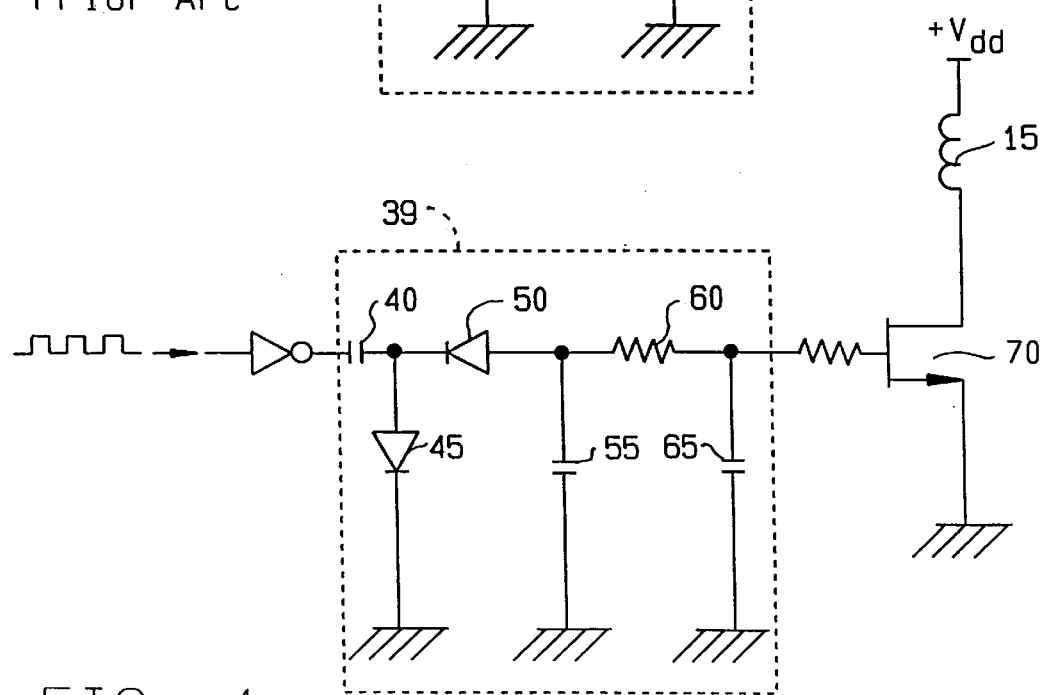
Figure 5:
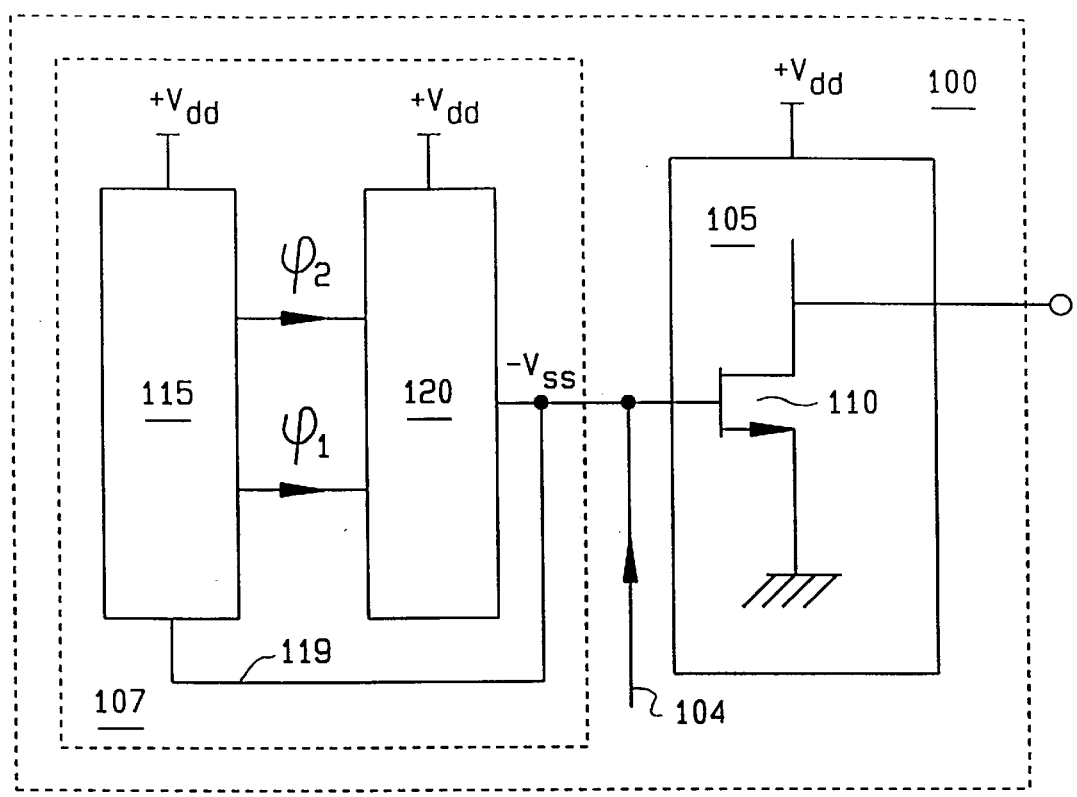
FIG. 5 is a block diagram of an amplifier of the present invention.

Referring to FIG. 5, an amplifier 100 of the present invention comprises an amplifying stage 105 having a depletion-mode FET 110, and a negative voltage generator 107 providing a negative bias to the FET. FET 110 receives an input ac signal 104 at its gate; the source of the FET is directly connected to ground; the drain is coupled a power supply, $+V_{dd}$.

Figure 6:
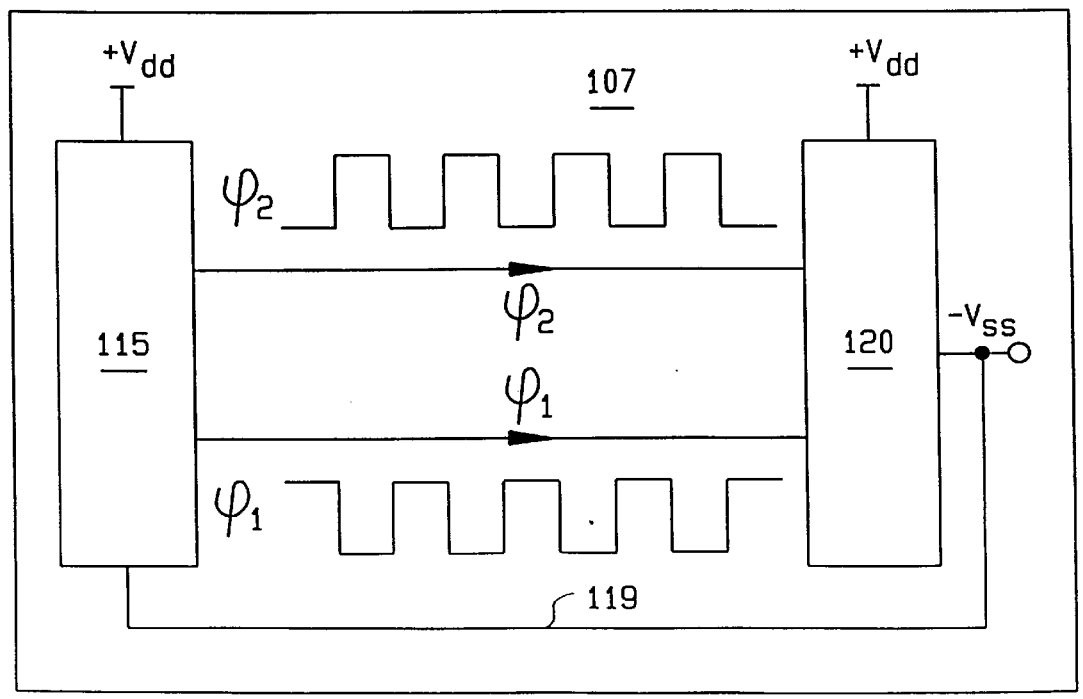
FIG. 6 depicts the block diagram of a negative voltage generator of the present invention.

Depicted in more detail in FIG. 6, negative voltage regulator 107 comprises two portions: a multivibrator 115 and a charge pump 120. Multivibrator 115 produces two clock signals, φ1 and φ2, preferably one being the inverting signal of the other. Receiving the two clock signals, charge pump 120 generates a negative voltage $-V_{SS}$ for biasing the FET in the amplifying stage. Advantageously, the negative voltage, $-V_{SS}$, generated by the charge pump, is provided back to the multivibrator by means 119 as a low reference potential. Because of this negative low reference potential, the clock signals generated by the charge pump contain a negative voltage period, which allows the charge pump to operate in a power efficient manner.

Figure 7:
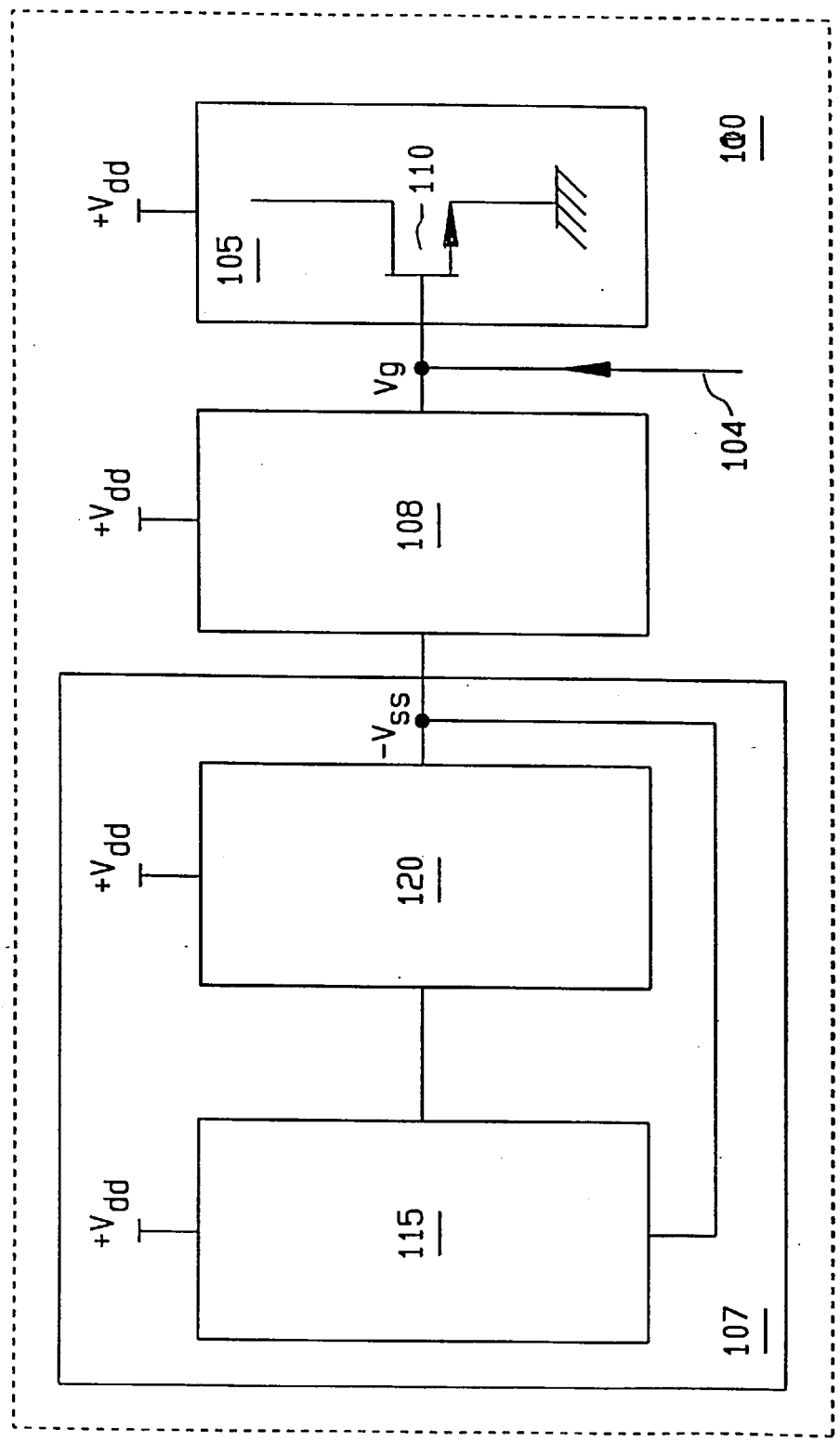
FIG. 7 shows the block diagram of a preferred embodiment of the amplifier.

In a preferred embodiment illustrated in FIG. 7, amplifier 100 further includes a negative voltage regulator 108 which receives the negative voltage $-V_{ss}$ generated by negative voltage generator 107 and provides a more precise negative voltage for biasing depletion-mode FET 110 to a desired operating point. Such desired operating point includes, for example, for class A operation, one half of $I_{dss}$ of the depletion mode FET, for class AB operation one quarter of $I_{dss}$, or around the pinch-off for class B operation.

In a preferred embodiment, amplifier 100 is a hybrid comprising two monolithic integrated GaAs circuits, one including amplifying stage 105 and negative voltage regulator 108 and the other containing negative voltage generator 115. Forming the amplifier as a hybrid reduces the interference between the input ac signal and the clock signals in the negative voltage generator. If desired, however, the entire amplifier can be made as a monolithic integrated circuit.

It should be noted that, although the amplifying stage as shown includes a single depletion-mode FET, it would be apparent to those of skill in the art that a cascade amplifying stage comprising a plurality of depletion-mode FET can be used in the amplifier, which is within the scope of the present invention.

As it will be detailed later, the amplifier of the present invention operates in a power efficient manner and in particular, consumes little power when in a standby mode. Moreover, the operating point of the FET is accurately set by the negative voltage regulator. Further, the amplifier is small in size and can be made at low cost. Because of those advantages, the amplifier is specially suitable for use in cellular communications.

In this application, unless otherwise specifically provided, a "negative" or "positive" potential or voltage refers to a potential with respect to ground. Thus, a negative voltage or potential is a potential that is more negative than the ground potential, and a positive voltage is a potential more positive than the ground potential. A "positive terminal of a power supply" used hereinafter refers to a terminal of the power supply that provides a positive voltage. A "positive power supply" refers to a power supply so connected that it provides a positive voltage to an amplifier.

A "field effect transistor" ("FET") used herein refers to any transistor that comprises a gate, a source and a drain, and that the current from the drain to source is controlled by the voltage between the gate and the source. It covers, without limitation, FETs based on any material such as silicon, GaAs, InP and it also includes heterojunction FETs based on material such as GaAlAs/GaAs, InGaAs/InP or Si/Ge.

A "GaAs FET" used herein refers to any FET that comprises GaAs material and it includes, without limitation, GaAs MESFETs, GaAs high-electron-mobility-transistors ("HEMTs") or GaAs modulation doped-FET ("MODFETs").

A "depletion-mode FET" used herein refers to any FET, the operating point of which is set by applying a negative voltage between the gate and the source. The term "enhancement-mode FET" used herein refers to any FET, the operating point of which is set by applying a positive voltage between the gate and the source.

The amplifier of the present invention will now be described in detail in terms of the negative voltage generator and the negative voltage regulator.

Figure 8A:
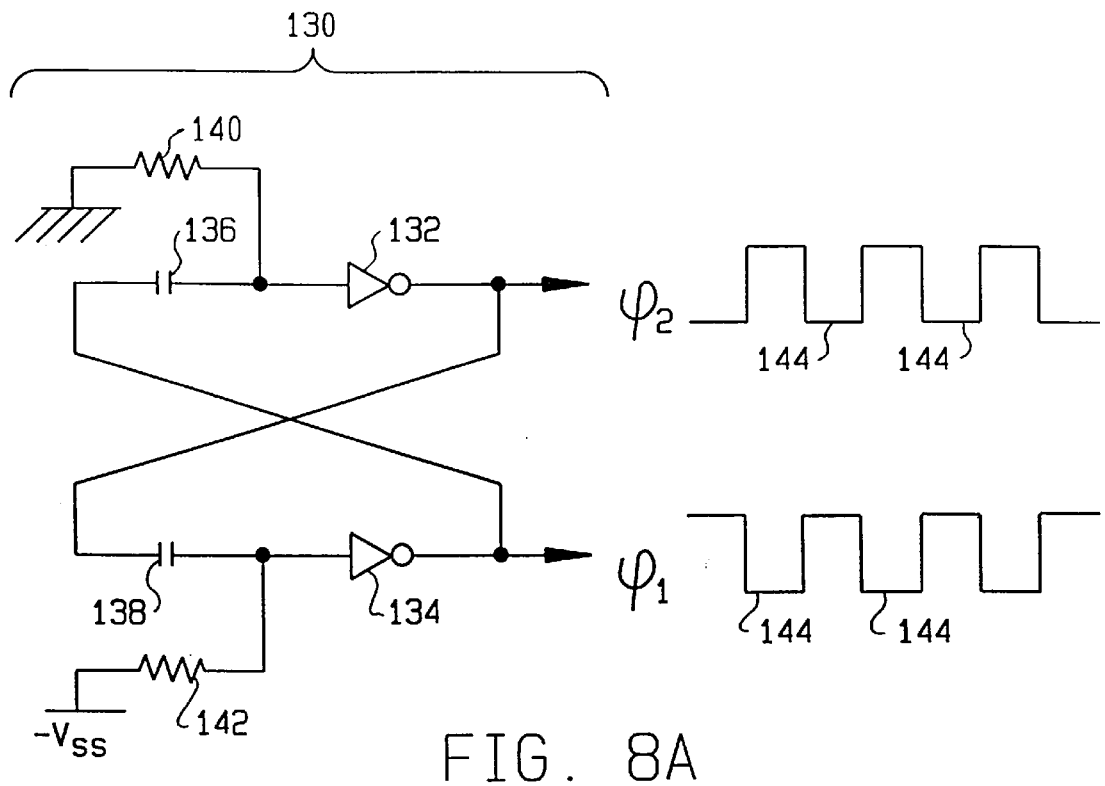
FIG. 8A is the block diagram of a multivibrator contained in the negative voltage generator.

FIG. 8A is a block diagram of a preferred embodiment of a multivibrator 130. Multivibrator 130 comprises two inverter 132 and 134. The input of inverter 132 is coupled to the output of inverter 134 through a capacitor 136, whereas the input of inverter 134 is coupled to the output of inverter 132 by a capacitor 138. A resistor 140 connects the input of inverter 134 to ground. The input of inverter 134, however, is connected to a negative voltage $-V_{SS}$ by a resistor 142. This multivibrator provides two inverting clocking signals φ1 and φ2 at the output terminals of the inverters, the period of the which depends on the values of resistors 140 and 142 and capacitors 136 and 138. Advantageously, because of the negative voltage $-V_{ss}$, output clock signals φ1 and φ2 include a negative potential period 144.

Figure 8B:
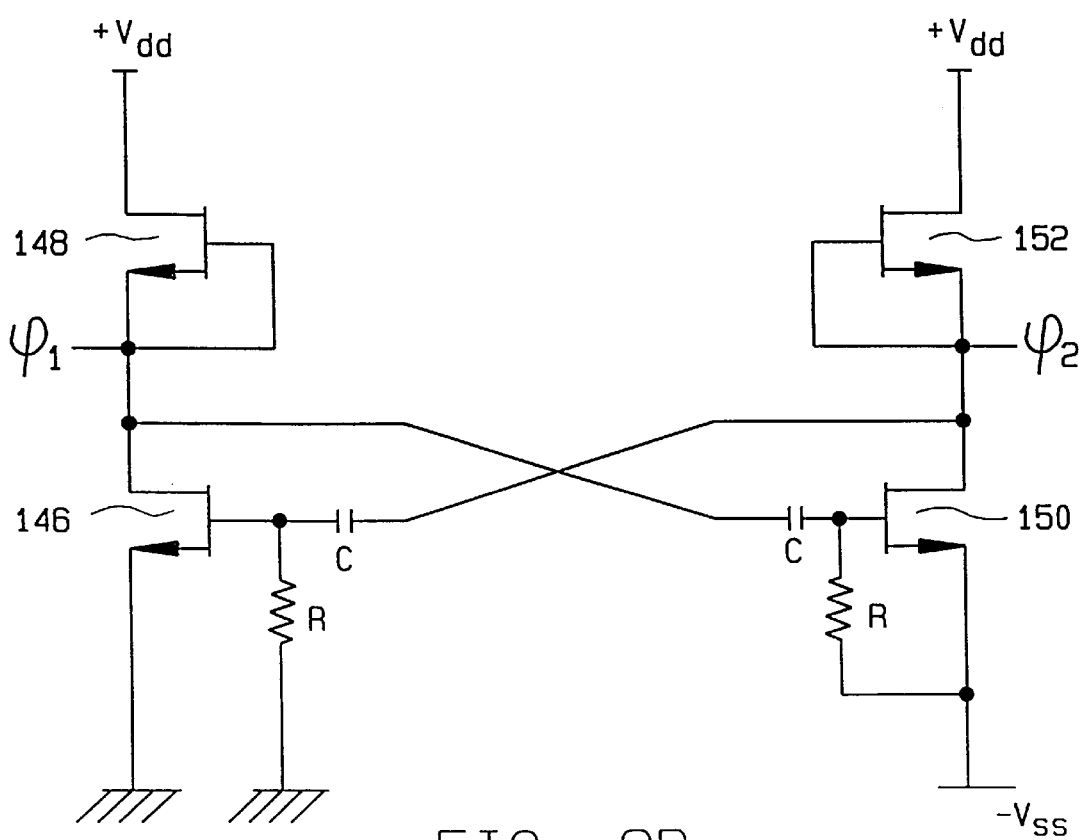
FIG. 8B is the schematic circuit diagram of the preferred embodiment of the multivibrator.

FIG. 8B illustrates the schematic circuit diagram of the preferred embodiment of the multivibrator, wherein the two inverters are formed by two pairs of GaAs FETs, 146 and 148, and 150 and 152, respectively. Preferably, all of the GaAs FETs are depletion-mode n-channel GaAs FETs and they have long gate-length to reduce power consumption. For example, the gate-lengths for FETs 146, 148, 150 and 150 are 4 microns, as compared to the gate-length of 0.5 micron for FET 110 in the amplifying stage. Longer gate-length results in lower current and it conserves power. In this multivibrator, FETs 148 and 152 functions as load to FETs 146 and 150 and they may be replaced with resistors.

It is important that the source of FET 150 is connected to the negative potential $-V_{SS}$. This negative potential causes the low potential of the clock signals to be negative, which, as detailed below, is critical for turning off depletion mode FETs in the following charge pump to achieve power efficient operation.

The charge pump of the present invention is now described with reference to FIGS. 9A–11.

Figure 9A:
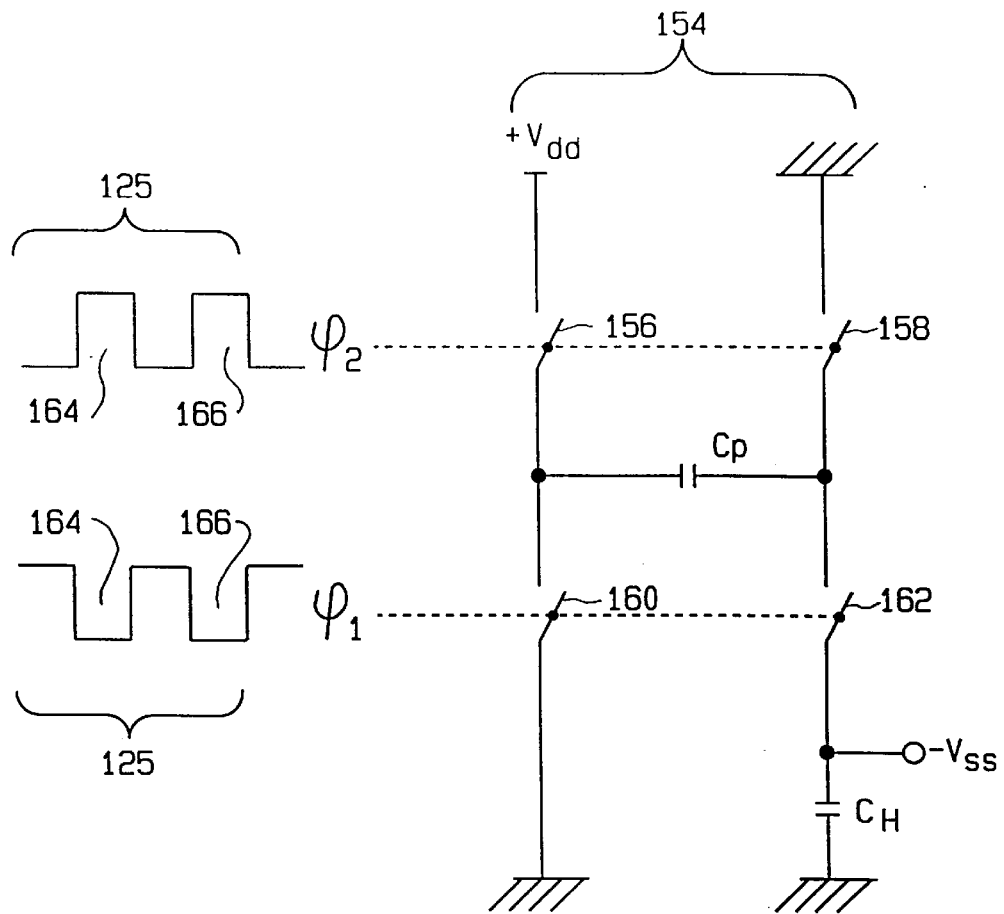
FIG. 9A depicts a charge pump used in the negative voltage generator.

Referring to FIG. 9A, a charge pump 154 of the present invention includes a first pair of electronic switches 156 and 158 driven by clock signal φ2, and a second pair of electronic switches 160 and 162 driven by clock signal φ2. Coupled between the first pair of switches is a pump capacitor $C_P$. A hold capacitor $C_H$ connects switch 162 to ground.

The charge pump operates as follows: inverting clock signals φ1 and φ2 contain two phases, a pump phase 164 and a transfer phase 166. During the pump phase, the first pair of switches are closed, connecting the pump capacitor between power supply $+V_{dd}$ and ground, and the second pair is open. The pump capacitor is thus charged by the power supply.

During the transfer phase, the first pair of switches are open and the second pair are closed. Consequently, a portion of the charge on the pump capacitor $C_P$ is transferred to the hold capacitor $C_H$. Because the voltage across capacitor $C_P$ cannot be instantly changed, switching from the pump phase to transfer phase produces a negative voltage across the hold capacitor.

The preferred charge pump of the present invention is especially power efficient for two reasons. First, because the clock signals are inverting, the first and second pairs of switches are not closed at the same time during either the transfer or pump phase and consequently, there is no direct dc current path from the power supply to ground. (As it will be discussed later, at the initial moment of switching from the pump phase to transfer phase, there may be a dc current path from the power supply through switches 156 and 160. This dc path was eliminated by slightly delaying the first clock signal φ1 by, for example, an RC network).

Second, when the charge pump is first turned on and begins to operate, during the transfer phase, a portion of the charge on the pump capacitor is transferred to the hold capacitor, and the negative voltage across the hold capacitor will continue to build during the transfer phase until it matches the negative voltage on the pump capacitor. Thereafter no further charge is transferred from the pump capacitor to the hold capacitor. Assuming a subsequent load circuit connected to $-V_{SS}$ draws little current, after the initial period, no charge is transferred from the pump capacitor to the hold capacitor; the charge pump thus draws little power from the power supply.

The charge pump is analyzed below in terms of its steady state voltage, output impedance, supply current waveforms and settling time, by breaking the operation into a piece-wise linear representation within each of the pump and transfer phase. Within a clock cycle, the duration of the pump phase is $T_1$ and the transfer phase is $T_2$.

PUMP PHASE

Figure 9B:
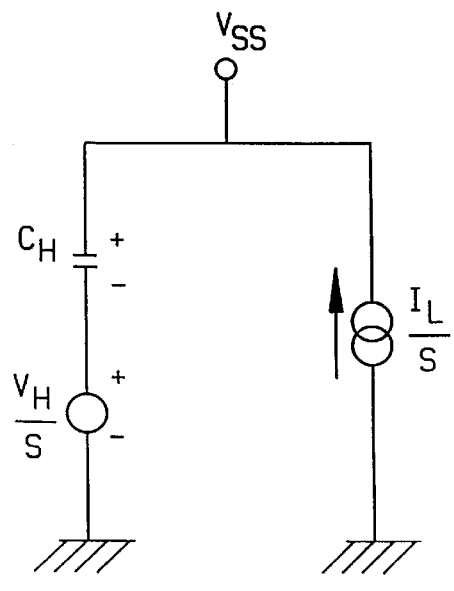
FIGS. 9B–H illustrates the equivalent circuit and results of simulation of the charge pump during different phase of operation.

FIG. 9B shows an equivalent circuit of the charge pump during the pump phase. The charged stored on the hold capacitor is represented by a step voltage source $V_H$. The hold capacitor is continually discharged during the entire pump phase by a dc load $I_L$. In the pump phase, the discharge is not replaced so the negative output voltage $V_{SS}$ is given by:

$$V_{SS}(s) = \frac{1}{SC_H}\frac{I_L}{S} + \frac{V_H}{S} \tag{1}$$

At the beginning of the pump phase (t=0), the negative voltage $V_{SS}$ is expressed as:

$$V_{SS}(T_1) = \frac{I_L}{C_H}T_1 + V_{SS}(0) \tag{2}$$

Thus, $V_{SS}$ displays ripples in its output waveform and the peak-to-peak amplitude of the ripples is $I_L T_1/C_H$. According to equation (2), the amplitude is reduced by increasing the value of hold capacitor $C_H$ or decreasing the length of the pump phase, $T_1$, or combination of both.

Figure 9C:
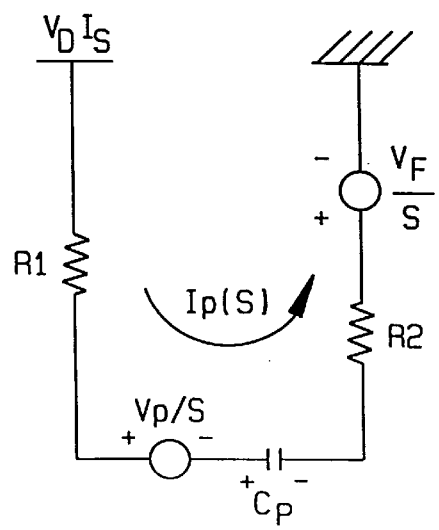

While hold capacitor $C_H$ is discharging, pump capacitor $C_P$ is charged during this pump phase. Referring to FIG. 9C, the charge stored in pump capacitor $C_P$ is represented by a voltage source $V_P$. Since Switch 158 may be implemented with diodes, a forward voltage drop of $V_F$ is included as the voltage drop on the diodes. This voltage drop can be set to zero for transistor-based switches (to a first order approximation). A pump current $I_P(S)$ is given by:

$$I_P(s) = \left(\frac{V_D - V_P - V_F}{R_P}\right)\left(\frac{1}{S + \frac{1}{R_P C_P}}\right) \tag{3}$$

$R_P=(R_1+R_2)$. In the time domain, the pump current is given by:

$$i_P(t) = \left(\frac{V_D - V_P - V_F}{R_P}\right)e^{-t/R_P C_P} \tag{4}$$

The transient voltage $V_{CP}$ across the pump capacitor is given by:

$$V_{CP}(s) = (V_D - V_P - V_F)\left[\frac{1}{S} - \frac{1}{S + \frac{1}{R_P C_P}}\right] \tag{5}$$

Note that $V_P$ represents the charge stored on the pump capacitor before the pump phase. The resulting voltage across $C_P$, $V_{PP}$, at the end of the pump phase (t=$T_1$ with t=0 at the beginning of the pump phase) is the sum of the initial voltage and the transient voltage:

$$V_{PP}(T_1) = V_{PP}(0) + (V_D - V_{PP}(0) - V_F)(1 - e^{-T_1/R_P C_P}) \tag{6}$$

TRANSFER PHASE

Figure 9D:
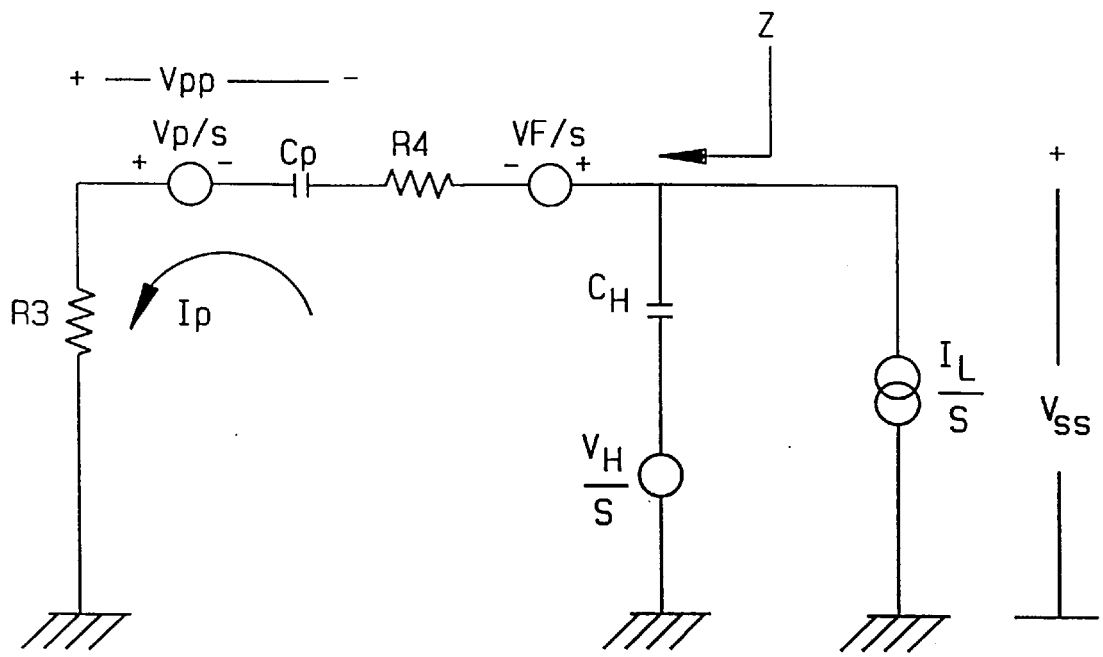

FIG. 9D shows an equivalent circuit diagram of the charge pump circuit during the transfer phase, where a forward voltage drop $V_F$ is included for the case when switch 162 is a diode. This circuit is analyzed below using linear superposition.

First, set all voltages to zero and analyze the effect of the load current. The output voltage $V_{SS}$ is given by:

$$V_{ss}(s) = Z\frac{I_L}{S} = \frac{I_L}{C_H}\left[\frac{S + \frac{1}{R_T C_P}}{S + \frac{1}{R_T C_S}}\right]\frac{1}{S^2} \tag{7}$$

where $R_T=(R_3+R_4)$ and $C_S$ is the series combination of the capacitance of $C_P$ and $C_H$. The voltage across the hold capacitor due to the load current alone is then expressed as $$V_{SS}(t) = \frac{I_L}{C_H}\left[\frac{C_S}{C_P}t + R_T C_S\left(1 - \frac{C_S}{C_P}\right)(1 - e^{-t/R_T C_S})\right] \tag{8}$$

where t=0 is the beginning of the transfer phase.

$V_{SS}$ and the impedance of the pump capacitor can be used to calculate a pump current, $I_P$, and then find the voltage across the pump capacitor:

$$\begin{array}{c}\text{Voltage Across} \\ \text{Pump Capacitor}\end{array} = \frac{I_L}{R_T C_H C_P}\left[\frac{1}{S + \frac{1}{R_T C_S}}\right]\frac{1}{S^2} \tag{9}$$

Note that the definition of the pump capacitor voltage leads to a sign change, so in the time domain the voltage due to the load current alone is expressed as $$V_{PP}(t) = -\frac{I_L}{C_H}\left[\frac{C_S}{C_P}t - R_t C_S \frac{C_S}{C_P}(1-e^{-t/R_T C_S})\right] \quad (10)$$

Figure 9E:
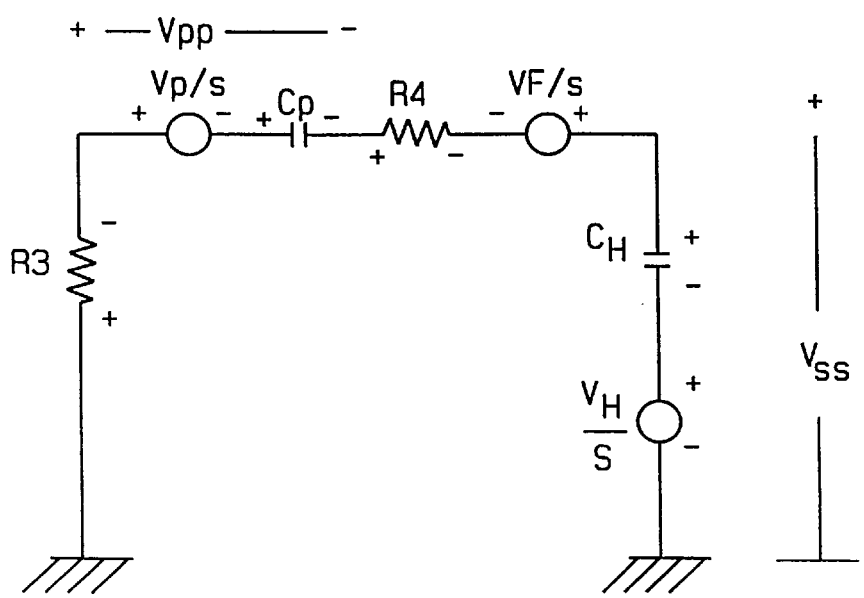

Next, set the load current to zero and restore all the voltages in the circuit, as shown in FIG. 9E. The voltage across the hold capacitor is given by $$\frac{\text{Voltage Across}}{\text{Hold Capacitor}} = \frac{(V_P - V_F + V_H)}{R_T C_H}\left(\frac{1}{S + \frac{1}{R_T C_S}}\right)\frac{1}{S} \quad (11)$$

In steady state, after initial start-up transients have subsided, $V_{SS}(0) = V_{SS}(T_1 + T_2)$ so that the voltage across the hold capacitor due to the initial voltages alone is expressed as $$V_{SS}(0) = V_{ss}(T_1) - (V_{PP}(T_1) - V_F + V_{SS}(T_1))\frac{C_S}{C_H}(1 - e^{-T_2/R_T C_S}) \quad (12)$$

Similarly, for the pump capacitor the voltage due to the initial voltages alone is expressed as $$V_{PP}(0) = V_{PP}(T_1) - (V_{PP}(T_1) - V_F + V_{SS}(T_1))\frac{C_S}{C_P}(1 - e^{-T_2/R_T C_S}) \quad (13)$$

Using linear superposition, the total voltage across the hold capacitor at the end of the transfer phase is given by combining equations (8) and (12):

$$V_{SS}(0) = V_{ss}(T_1) - [V_{PP}(T_1) - V_F + V_{SS}(T_1)]\frac{C_S}{C_H}(1 - e^{-T_2/R_T C_S}) + \frac{I_L}{C_H}\left[\frac{C_S}{C_P}T_2 + R_T C_S\left(1 - \frac{C_S}{C_P}\right)(1 - e^{-T_2/R_T C_S})\right] \quad (14)$$

The total voltage across the pump capacitor is obtained by combining Equations (10) and (13):

$$V_{PP}(0) = V_{PP}(T_1) - [V_{PP}(T_1) - V_F + V_{SS}(T_1)]\frac{C_S}{C_P}(1 - e^{-T_2/R_T C_S}) - \frac{I_L}{C_H}\left[\frac{C_S}{C_P}T_2 + R_T C_S \frac{C_S}{C_P}\right](1 - e^{-T_2/R_T C_S}) \quad (15)$$

CONSERVATION OF CHARGE

In steady state, the total charge supplied during a clock cycle to the load must equal the charge obtained from the power supply during the pump phase:

$$Q_{Pump} = Q_{Load} \quad (16)$$

$$\int_0^{T_1} i_P(t)dt = I_L(T_1 + T_2)$$

Using Equation (4), the steady pump capacitor voltage at the beginning of a clock cycle is then:

$$V_{PP}(0) = V_D - V_F - \frac{I_L(T_1 + T_2)}{C_P(1 - e^{-T_1/R_P C_P})} \quad (17)$$

Figure 9F:
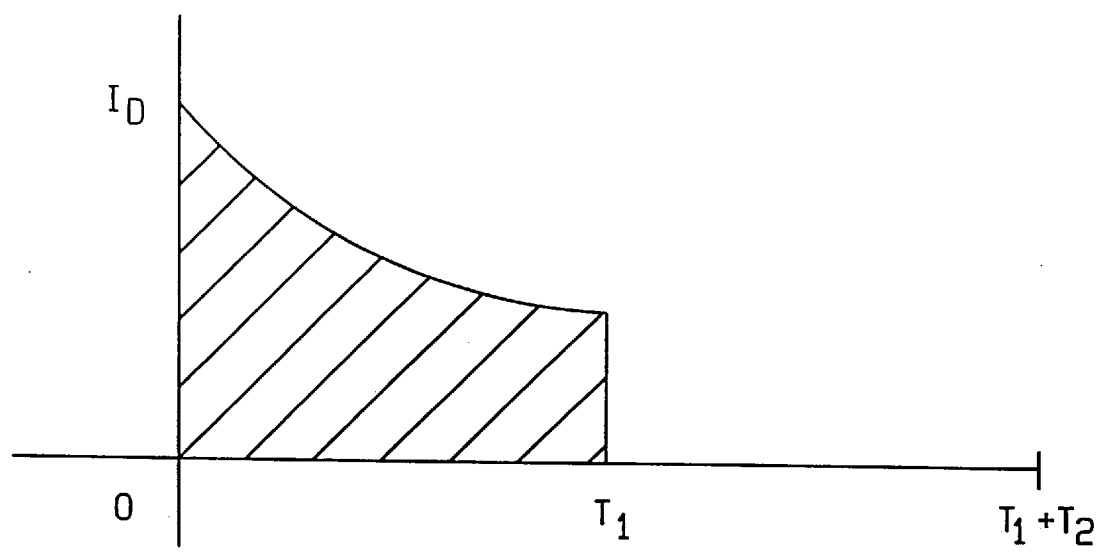

The supply current is then given by:

$$i_P(t) = \frac{I_L(T_1 + T_2)}{R_P C_P(1 - e^{-T_1/R_P C_P})}e^{-t/R_P C_P} = I_o e^{-t/R_P C_P} \quad (18)$$

as shown in FIG. 9F.

OUTPUT VOLTAGE AND IMPEDANCE

The steady state voltages at the beginning and end of the pump phase are given by Equations (2), (6), (14) and (17). These may be solved for $V_{SS}(0)$ to obtain the steady state output voltage. Substituting Equations (2), (6) and (17) into Equation (14), the following equation is obtained:

$$V_{SS} = 2V_F - V_D + I_L R_{SS} \quad (19)$$

Where $R_{SS}$ is the derivative of $V_{SS}$ with respect to $I_L$.

Figure 9G:
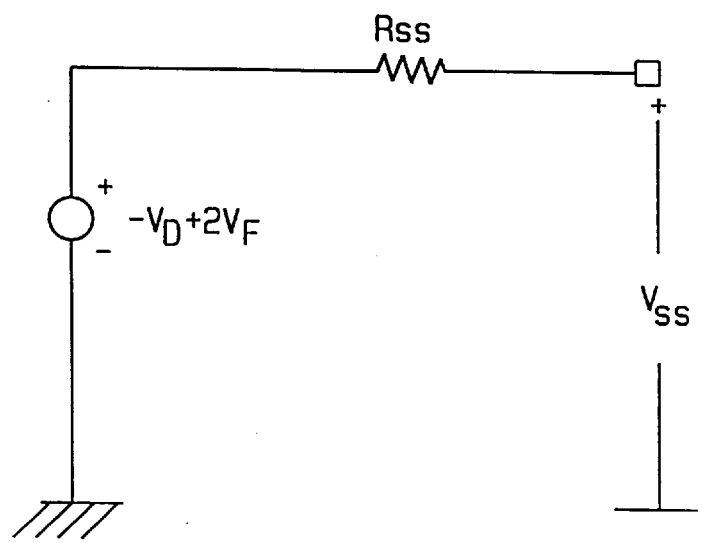

The dc behavior of the charge pump is represented as a voltage source in series with an output resistor $R_{SS}$ as shown in FIG. 9G. The value of $R_{SS}$ is given by:

$$R_{SS} = R_T\left(1 - \frac{C_S}{C_P}\right) + \frac{T_1 + T_2}{C_P}\left[\frac{1}{(e^{T_1/R_P C_P} - 1)} + \frac{1}{(1 - e^{-T_2/R_T C_S})}\right] + \frac{T_1}{C_H}\left[\frac{1}{(e^{T_2/R_T C_S} - 1)}\right] + \frac{T_1}{2C_H} \quad (20)$$

SETTLING TIME

An important consideration is how fast the charge pump reaches a steady state voltage when it is first turned on. The above equations can be written in matrix form to give a transition matrix A that relates the voltages at the start of cycle to the voltages at the beginning of the next cycle. This matrix can be applied m times to give the voltages at t=MT, where $T = T_1 + T_2$:

$$x_m = \begin{bmatrix} V_{ss}(mT) \\ V_{PP}(mT) \\ 1 \end{bmatrix} = A^m x_o \quad (21)$$

The transient behavior of $V_{SS}$ is almost exponential. While it is difficult to solve for a "best fit", a good estimate of the behavior is given by:

$$V_{SS}(t) \approx (-V_D + 2V_F + I_L R_{SS})\left(1 - e^{-t/R_{SS} C_H\left(1 + \frac{C_S}{C_H}\right)}\right) \quad (22)$$

Figure 9H:
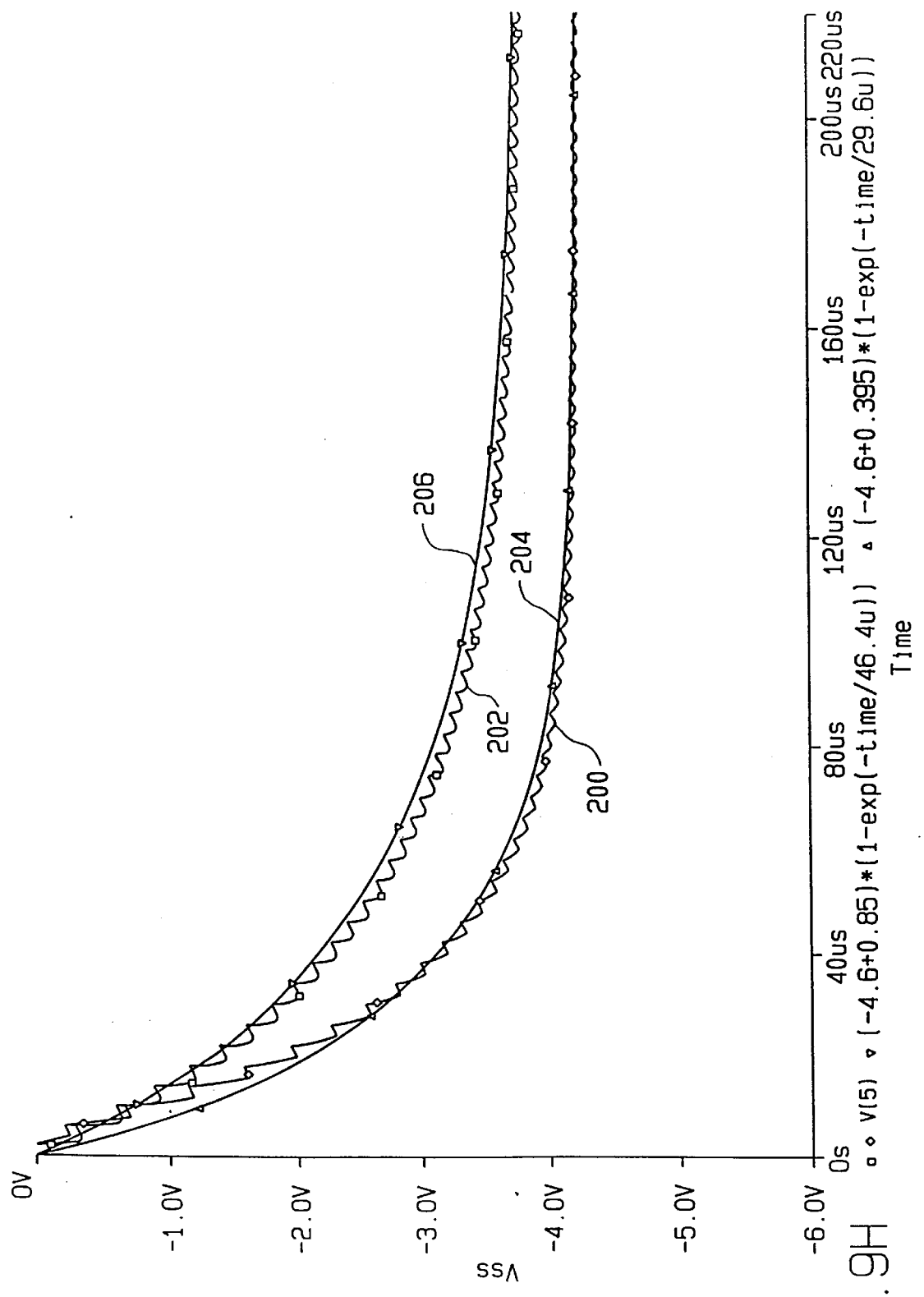

The time constant is given by $T_{ON} = R_{SS}CH (1 = C_S/C_H)$. FIG. 9H shows the comparison between the result of a PSICE simulation (curve 200 for charge pump capacitor of 100 nano-farads and curve 202 for charge pump capacitor of 10 nano-farads) and the ones obtained with Equation (22) (curves 204 and 206 for charge pump capacitor of 100 nano-farads and curve 202 for charge pump capacitor of 10 nano-farads, respectively). The y-axis of the plot is the negative voltage $V_{SS}$ as a function of time t, and the x-axis is the time. FIG. 9H shows that Equation (22) fairly accurately calculates $V_{ss}$.

Based on the above analysis, the sensitivity of some important charge pump parameters such as switch resistance and the capacitance of the pump and hold capacitors are summarized below:

| Parameter | Decrease Value | Increase Value |
|---|---|---|
| switch resistance | *lower output impedance<br>*greater device size<br>*lower $T_{ON}$ | *higher output impedance<br>*smaller device size<br>*higher $T_{ON}$ |
| pump capacitor | *higher output impedance<br>*smaller physical size<br>*higher $T_{ON}$ | *lower output impedance<br>*larger physical size<br>*lower $T_{ON}$ |
| hold capacitor | *higher output impedance<br>*smaller physical size<br>*higher output ripple<br>*lower $T_{ON}$ | *lower output impedance<br>*larger physical size<br>*lower output ripple<br>*higher $T_{ON}$ |

The above analysis sets forth the basic design principles for charge pump circuit.

Figure 10:
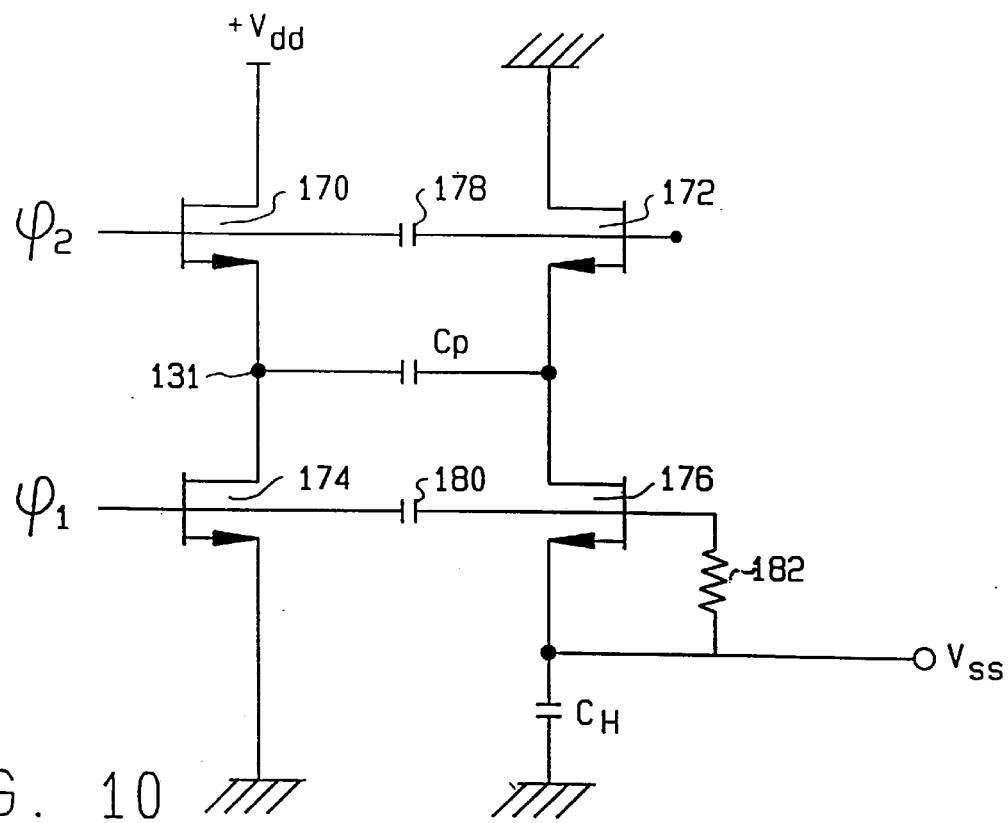
FIG. 10 shows the schematic circuit diagram of a preferred charge pump.

In a preferred embodiment, the schematic circuit diagram of which is shown in FIG. 10, the charge pump comprises four depletion-mode GaAs FETs 170, 172, 174 and 176. The gates of FETs 170 and 172 are connected by a capacitor 178. The gates of FETs 174 and 176 are coupled by a capacitor 180. To ensure FET 176 be turned off during the pump phase, its gate is bootstrapped to the negative voltage $-V_{ss}$ by a resistors 182.

This preferred charge pump operates as follows: at the beginning of the pump phase, the potential at the drain of FET 174, which is connected to the source of FET 130, is close to the ground potential. The positive pulse in the clock signal φ2 applied to FET 170 and the negative pulse in clock signal φ1 applied to FET 174 turn on FET 170 and turn off FET 174. Preferably, the positive and negative pulses are such that FET 170 remains turned on and FET 174 remains turned off during the entire pump phase.

Still at the beginning of the pump phase, the potential at the source of FET 172, which is connected to the drain of FET 176, is close to a steady state negative potential $-V_{ss}$ generated by the charge pump. The positive pulse of clock signal φ2 applied to the gate of FET 172 through capacitor 178 turns on FET 172. Preferably, positive pulse of clock signal φ2 keeps FET 172 turned on during the entire pump phase.

Also at the beginning of the pump phase, the negative pulse of φ1 applied to FET 176 through capacitor 180 turns off the FET. Preferably, with a properly designed negative pulse, FET 176 remains turned off during the entire pump phase. Thus, during the pump phase, the charge capacitor is charged.

Conversely, during the transfer phase, FETs 170 and 172 are turned off and FETs 174 and 176 are turned on, and a portion of the charge stored on the charge capacitor is transferred to the hold capacitor.

Figure 11:
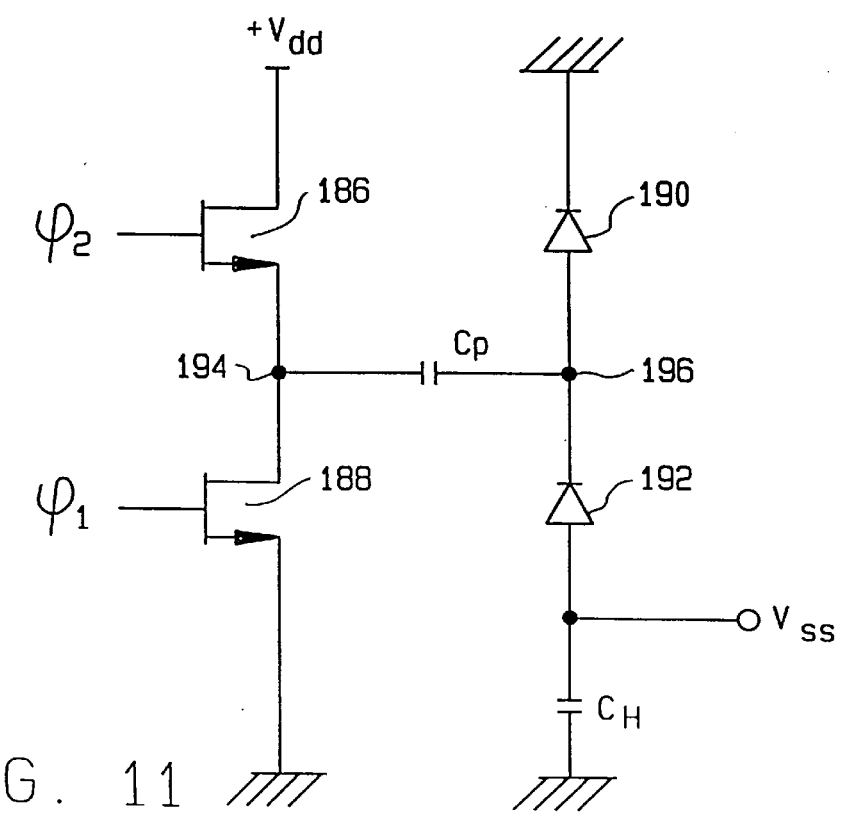
FIG. 11 illustrates the schematic circuit diagram of another preferred embodiment of the charge pump.

In another preferred embodiment, the schematic of which is illustrated in FIG. 11, a charge pump comprises two depletion mode GaAs FETs 186 and 188 connected in series and between power supply $+V_{dd}$ and ground, and two diodes 190 and 192. A hold capacitor $C_H$ is connected between ground and diode 192. A charge capacitor $C_P$ is connected between the FETs 186 and the diodes.

This charge pump operates as follows: during the pump phase, a positive pulse in clock signal φ2 applies to FET 186 and turns it on. Meanwhile, FET 188 is turned off by a negative pulse in clock signal φ1. Consequently, charge capacitor $C_P$ is charged through the loop including the power supply $+V_{dd}$, FET 186, diode 90 and ground. During this time, diode 192 does not conduct current because it is reverse biased.

During the transfer phase, FET 186 is turned off by clock signal φ2 and FET 188 is turned on by clock signal φ1, thus connecting one end 194 of the charge capacitor to the ground and forcing the voltage at the other end 196 to become negative. Diode 192 therefor becomes forward biased and conducting. As a result, a negative voltage is provided at the junction between diode 192 and the hold capacitor $C_H$. Diode 190 is turned off because it is reverse biased.

It will be apparent to those of skill in the art that, although the described preferred embodiments comprises depletion mode GaAs FETs for they provide higher current than enhancement-mode FETs, other types of FETs including enhancement mode FETs or silicon FETs may also be used in the charge pump, which are all within the scope of the present invention.

Figure 12A:
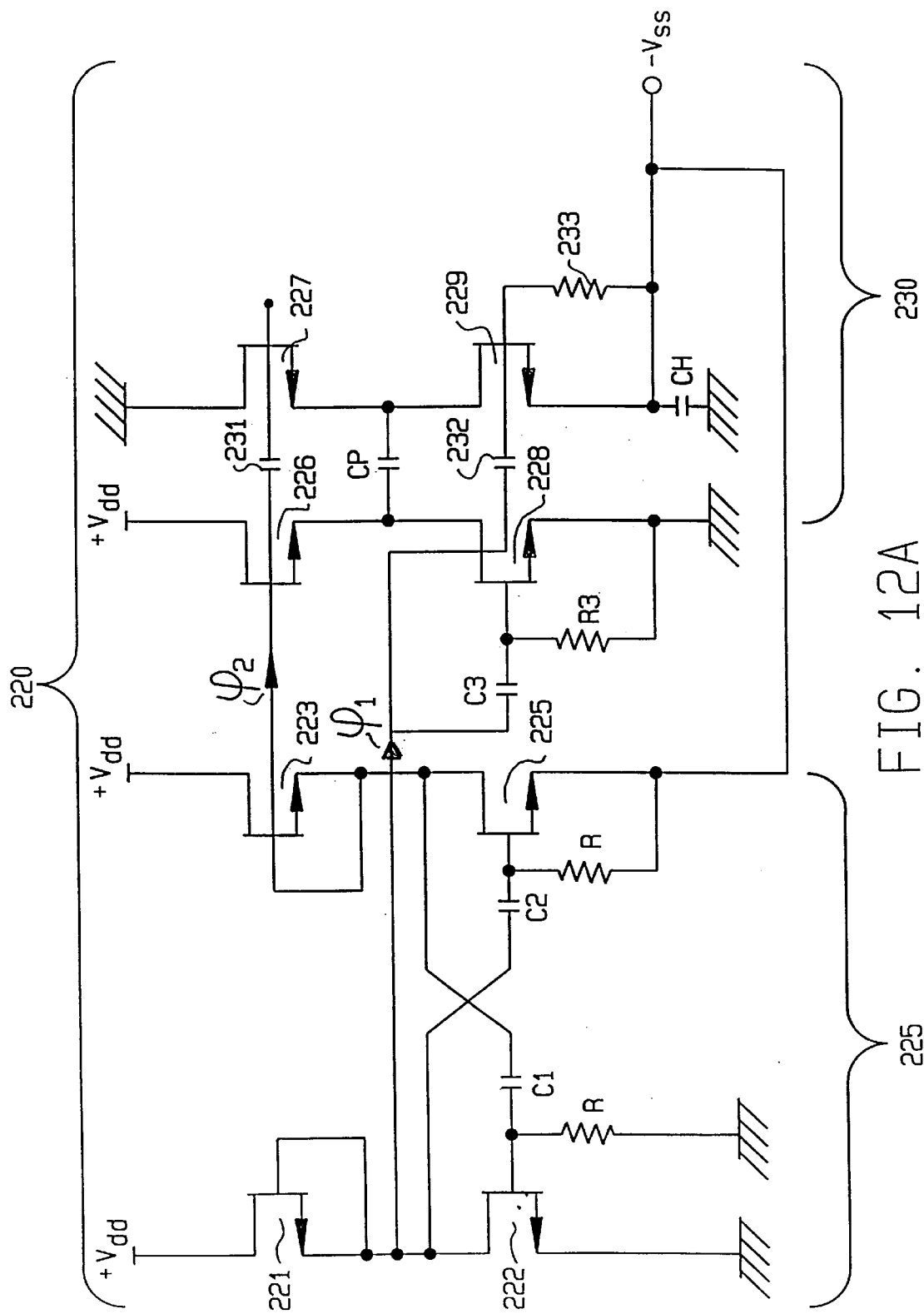
FIGS. 12A–B show the schematic circuit diagram of a preferred embodiment of the negative voltage generator and a clock signal waveform within the generator, respectively.

FIG. 12A illustrates the schematic circuit diagram of a preferred embodiment of the negative voltage generator of the present invention. In the circuit diagram, "Vdd" is a positive terminal of a power supply; "$V_{ss}$" indicates a circuit terminal where an output negative voltage $-V_{ss}$ is provided. Preferably, all of the components except pump capacitor $C_P$ and hold capacitor $C_H$ are monolithically integrated on a GaAs substrate. Because the pump capacitor $C_P$ and hold capacitor $C_H$ are generally large in size, they are off-chip components externally connected to the integrated circuit.

As shown, a negative voltage generator 220 comprises a multivibrator 225 generating inverting clock signals φ1 and φ2, and a charge pump 230 which receives the clock signals and generates a negative voltages, $-V_{ss}$. An RC network including a capacitor $C_3$ and a resistor R3 couples clock signal φ1 to FET 228 of the charge pump.

Multivibrator 225 includes four depletion-mode GaAs MESFETs, two capacitors $C_1$ and $C_2$, and two resistors R. The period of the clock signals depends on the capacitance of capacitors $C_1$ and $C_2$ and the resistance of resistors R, and it is about 2Rx ($C_1+C_2$).

The charge pump has been described in detail previously in this application. Importantly, the negative voltage $-V_{ss}$ generated at the output of the charge pump is provided back to the multivibrator and more specifically, to the source of FET 225 in the multivibrator to ensure the lower potential of the clock signals is negative. The negative period in the clock signal ensures the FETs in the charge pump are properly turned off when required.

When coupling clock signal φ1 to FET 228 of the charge pump, the RC network of C3 and R3 introduces a slight delay in the clock signal for turning on FET 228 during the initial moment of the transfer phase such that FETS 228 is turned on only after FETs 226 is turned off. As a result, there is no dc current path from $+V_{dd}$ to the ground through FETs 226 and 228 when the charge pump switches from the pump phase to the transfer phase. Although in this preferred embodiment the RC network is used to provide such delay, it should be apparent to one of skill in the art that other components may be used to create the delay.

More specifically, for clock signal φ1, because the source of FET 228 is connected to ground, the source-gate junction of FET 228 clamps clock signal φ1 so that it swings between approximately 0.7 volt to a negative peak value $V_1$ approximately equal to $-(V_{dd}-0.5)$ volts. In a preferred embodiment, $V_{dd}$ is 6 volts, and the negative peak $V_1$ is about −5.5 volts.

Figure 12B:
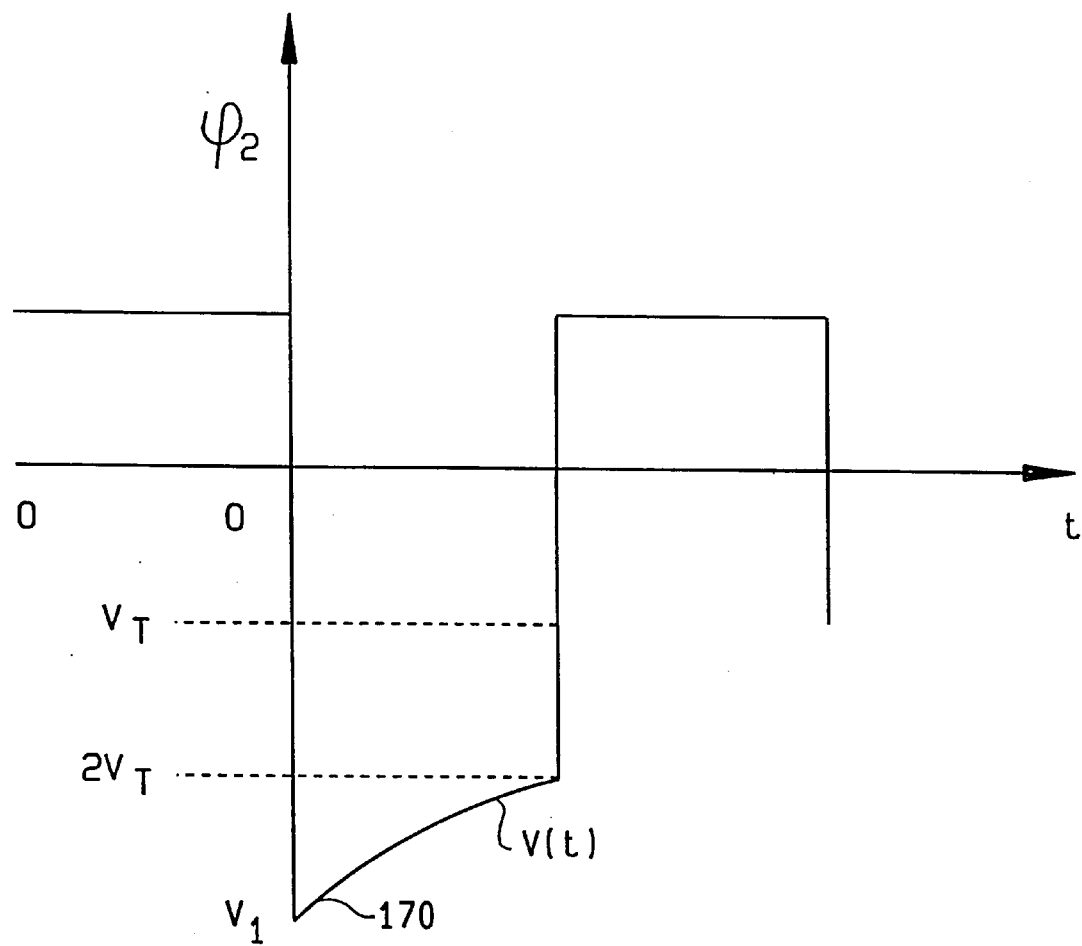

FIG. 12B illustrates the waveform of clock signal φ1. During the pump phase, the amplitude V(t) of clock signal φ1 is given as $$V(t)=V_1 \exp(-t/(R_3C_3)).$$

Based on this, t is expressed as $$t = R_3 C_3 \ln(V_1/V(t))$$

In order to keep FET 228 turned completely off during the entire pump phase, the gate-to-source voltage of FET 228 should be at least less than twice of the threshold hold of the FET $V_T$ at the end of the pump phase. Under this condition, the time at the end of the pump phase, $t_0$, is given as $$t_0 = R_3 C_3 \ln(V_1/2V_T)$$

To keep FET 228 turned off during the pump phase, $t_0$ must satisfy the condition $$T_0 > T/2 = R(C_1 + C_2)/2.$$

Consequently, the following condition is derived $$C_3 > (C_1 + C_2)/(2\ln(V_1/2V_T)).$$

This is the requirement for capacitor $C_3$ to keep FET 228 turned off during the entire pump phase.

The threshold voltage, $V_T$, for FET 228 is generally the same for all the other FETs in the negative voltage generator. For cable TV applications which generally requires less power than for cellular applications, the threshold voltage of the FETs is lower than that for power amplifiers used in cellular phones. Their comparison as well as their effect on the value of $2\ln(V_2/2V_T)$ is listed below

| Application | $V_T$ (V) | $2\ln(V_1/2V_T)$ |
|---|---|---|
| Cable TV Set-top | −0.5 | 3.41 |
| Power Amplifier | −1.4 | 1.35 |

During the pump phase, FET 228 is turned off by a negative pulse of clock signal φ1, which also propagates to the gate of FET 229 through a capacitor 232. Because the gate of FET 229 is bootstrapped to the negative voltage, −Vss, the gate voltage becomes more negative than −Vss, and FET 229 is turned off. During this phase, FET 226 is turned on by the positive voltage pulse in clock signal φ1, which also turns on FET 227 through a capacitor 150.

During the transfer phase, FETs 228 and 229 are turned on by the positive pulse of clock signal φ2. FETs 226 and 227, however, are turned off by the negative voltage pulse of clock signal φ1. In this way, the charge pump circuit operates in a power efficient fashion.

Figure 13:
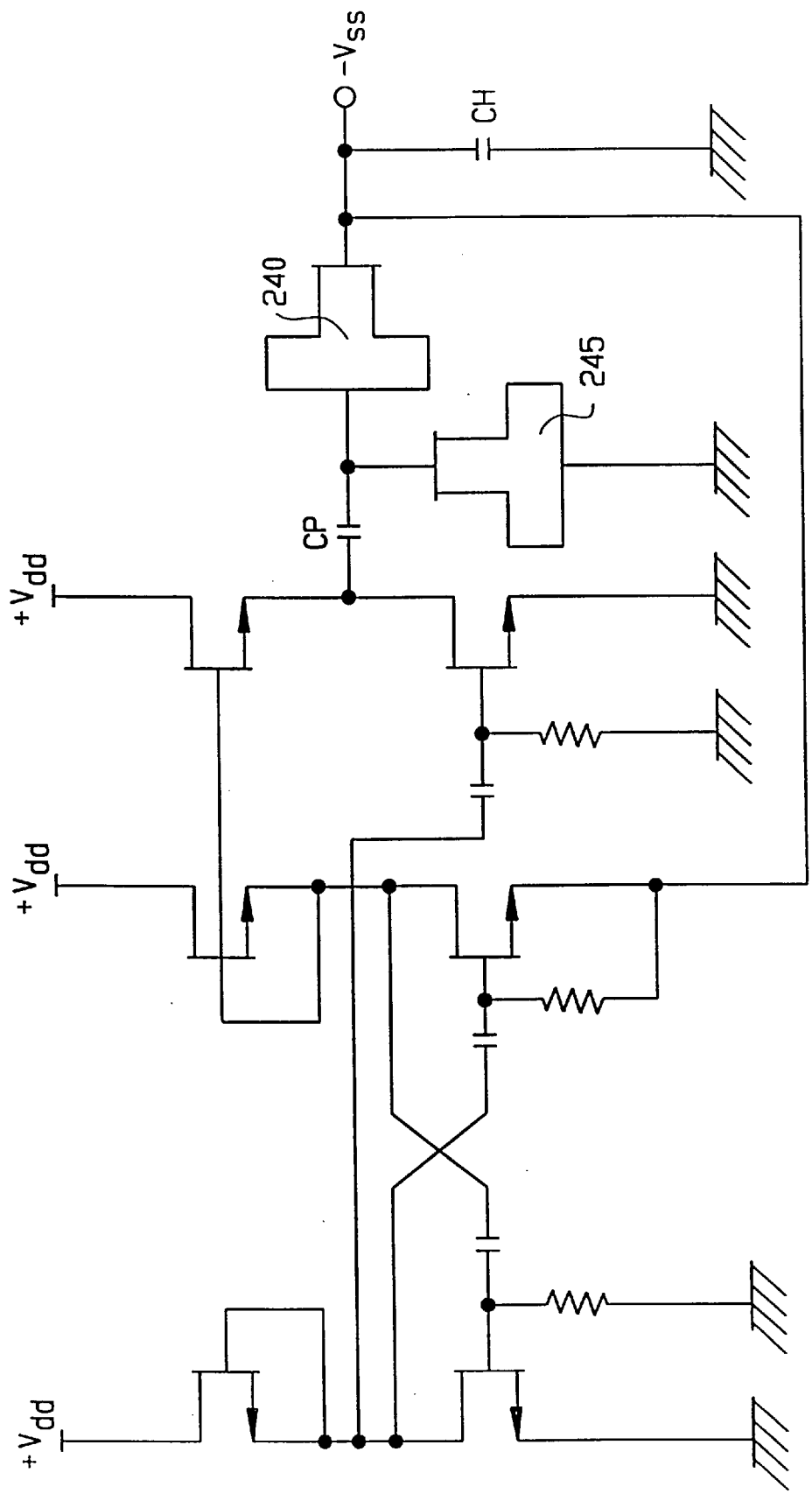
FIG. 13 shows the schematic circuit diagram of another preferred embodiment of the negative voltage generator.

FIG. 13 depicts another preferred embodiment of the negative voltage generator wherein two diodes are used in the charge pump. In particular, diodes 240 and 245 are GaAs Schottky diodes formed by connecting the drain and the source of a GaAs FET together as the cathode and by using the gate of the FET as the anode. Preferably, except the pump and hold capacitors, this negative voltage generator is formed as a GaAs MMIC. The multivibrator and the charge pump have been described with reference to FIG. 8B and FIG. 11 and therefore will not be described in detail here.

In a preferred embodiment, the negative voltage generated by the negative voltage generator is not directly used to bias the depletion mode FET in the amplifying stage because (1) the negative voltage contains ripples, and (2) the negative voltage is not precise enough to accurately bias the FET at a desired operation point. It is preferred to reduce the ripple effect of the negative voltage and to accurately regulate the negative voltage to a desired value.

Figures 14, 15:
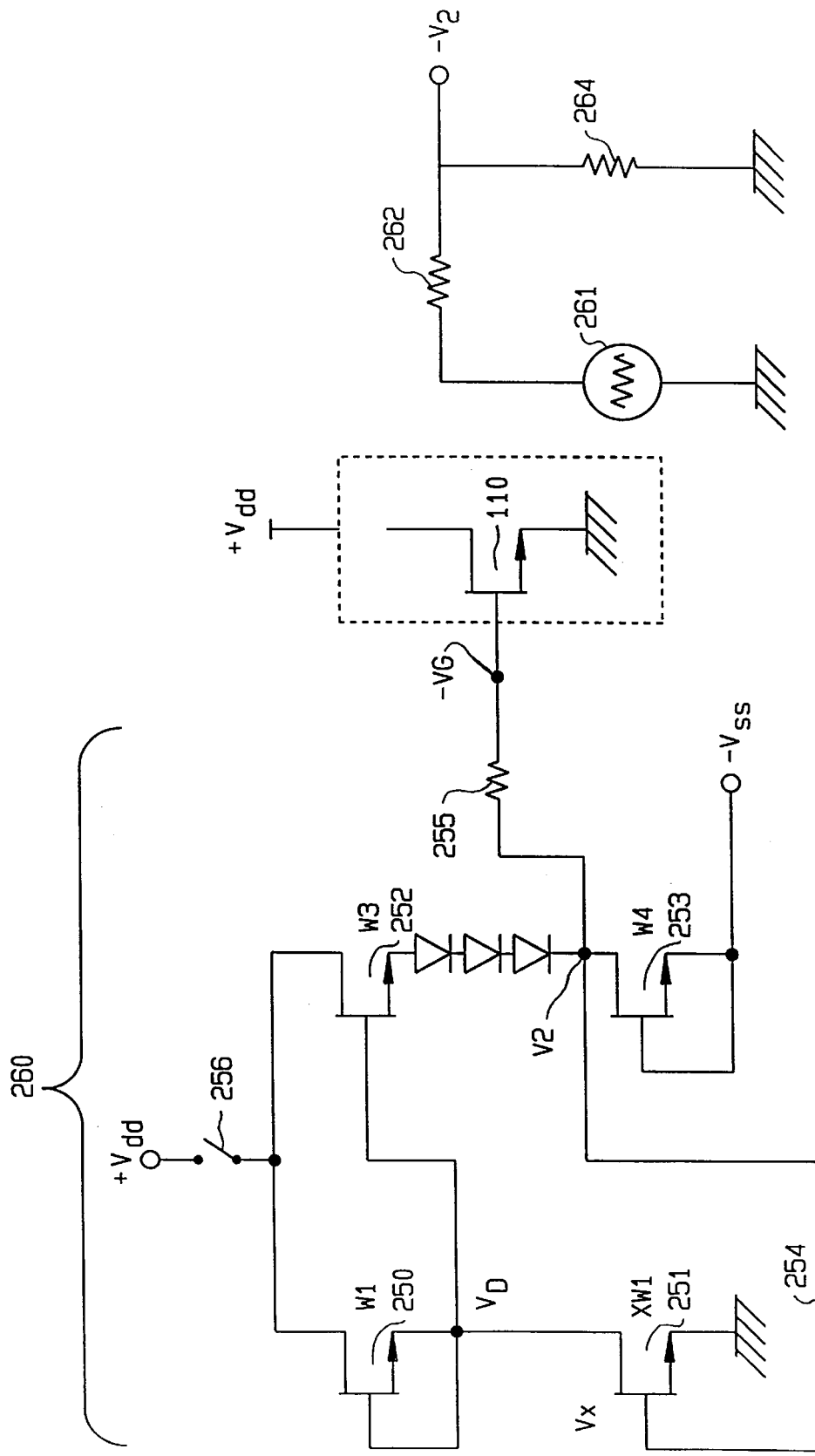
FIG. 14 depicts the schematic circuit diagram of a preferred embodiment of the negative voltage regulator of the present invention.
FIG. 15 depicts an output small signal equivalent circuit of the preferred embodiment of the negative voltage regulator.

FIG. 14 depicts the schematic circuit diagram of a preferred embodiment of a GaAs negative voltage regulator 260 in accordance with the present invention. The regulator utilizes a current mirror and it operates to reduce the ripples and provides a more accurate bias. More specifically, negative voltage regulator 260 includes an FET 250 as a current source, and FETs 251, 252 and 253. The negative voltage to be regulated, $-V_{ss}$, is applied to the source of FET 253, whereas the regulated negative voltage, $-V_G$, is provided at the drain of the same FET. Preferably, regulator 260 is monolithically integrated with the amplifying stage. The regulator further includes an on/off switch 250 which is closed when the amplifier is in operation, and opens when the amplifier is in a standby mode.

The dimensions of FETs 250 and 251 are determined as follows: FETs 250 and 251 are made to have the same gate-length and the same pinch-off characteristics that FET 110 has, preferably by making them on the same semiconductor wafer with the same manufacturing steps. The gate-width of FET 251, however, is a predetermined factor X, determined on the basis of the desired operating point, times the gate width of FET 250.

Factor X equals to the zero-bias saturation current of FET 110 divided by the intended operating current of the FET. For example, to bias FET 110 at one half of its zero-bias current $I_{dss}$ for class A operation, factor X is 2. For class AB operation where FET 110 is biased at one quarter of the zero-bias current $I_{dss}$, the factor X is 4.

The negative voltage regulator operates as follows: because FETs 250 and 251 are connected in series, their currents must be equal. As a result, the gate voltage $V_X$ of FET 251 must be such that it biases the FET to provide a current equal to that of FET 250. For example, if factor X is 1, which means FET 251 has the same gate-width that FET 250 has, the gate voltage $V_X$ of FET 251 must be zero, since the gate-to-source voltage of FET 250 is zero. If factor X is 2, in order to maintain the same current in FETs 250 and 251, the voltage at the drain of FET 251, $V_D$, will be pulled toward the ground potential, which also causes the voltage at FET 253's drain $V_Z$ to decrease. $V_D$ and $V_Z$ will continue to decrease until the current through FETs 250 and 251 are equal. The voltage $V_X$ will be the gate voltage needed to bias an FET 110 at one half of its zero-bias saturation current $I_{dss}$.

If factor X is 4, FET 110 is biased to provide one quarter of its zero-bias current $I_{dss}$. Accordingly, by choosing the appropriate gate-width ratio between FETs 251 and 250, i.e., factor X, FET 110 is biased at desired operating point. For example, by making the gate width of FET 251 ten time as wide as that of FET 250, i.e. factor X be 10, FET 110 will be biased at one-tenth of its $I_{dss}$.

In addition to provide a desired gate bias voltage for FET 110, the negative voltage regulator also reduces ripples in the waveform of the negative voltage $V_{ss}$. Referring to FIG. 15, which shows a small signal equivalent circuit of an output portion of the regulator, the ripples in negative voltage $-V_{SS}$ are represented by an ac voltage source 261. Voltage source 261 is applied to a voltage-dividing network consisting of resistors 262 representing the small-signal drain-to-source resistance ("$r_{ds}$") of FET 253, and resistor 264 representing an output small signal resistance $R_{out}$ of the circuit including FETs 250, 251 and 252. Due to this voltage-dividing network, the amplitude of the ripples at the drain of FET 253 is reduced by a factor of $$R_{out}/(R_{out} + r_{ds}) = 1/(1 + r_{ds}/R_{out})$$

The output resistance $R_{out}$ is evaluated as follows: referring to FIG. 15, if voltage $V_Z$ varies, such variation will be amplified by the gain of an inverting gain stage formed by FETs 250 and 251. Consequently, $R_{out}$ is given as $$R_{out}=R_{out}(W3)/(1+A)$$

where $R_{out}(W3)$ is the output resistance of FET 252 and A is the dc gain of the gain stage. $R_{out}(W3)$ is given as $$R=1/(g_m W_3)$$

where $g_m$ is the transconductance and $W_3$ is the gate-width of FET 252. If the gate width of FET 252 is about 80 microns and the FET is biased at one quarter of its $I_{dss}$, its output resistance $R_{out}(W3)$ is approximately 200 ohms. Considering the dc gain of the gain stage is approximately 60, the output resistance $R_{out}$ is thus approximately 4 ohms.

Considering the value of $r_{ds}$ is approximately around 10,000 ohms, the output amplitude of ripples will be reduced by as high as 60 dB. In this way, the negative voltage regulator reduces the ripples presented in the negative voltage generated by the negative voltage generator.

Another advantage of the regulator is that it consumes little power when in the standby mode. Referring to FIG. 14, when the regulator is in the standby mode, switch 256 opens and as a result, the regulator does not draw any power from the positive power supply $+V_{dd}$. In addition, the only conducting FET in the regulator is FET 253 which provides the full and unregulated negative voltage $-V_{ss}$ to the gate of FET 110 to turn it off. Since the gate leakage current of an FET is quite small, FET 110 thus draws little current from the negative voltage through FET 253. Consequently, the regulator consumes little power when in the standby mode.

Figure 16:
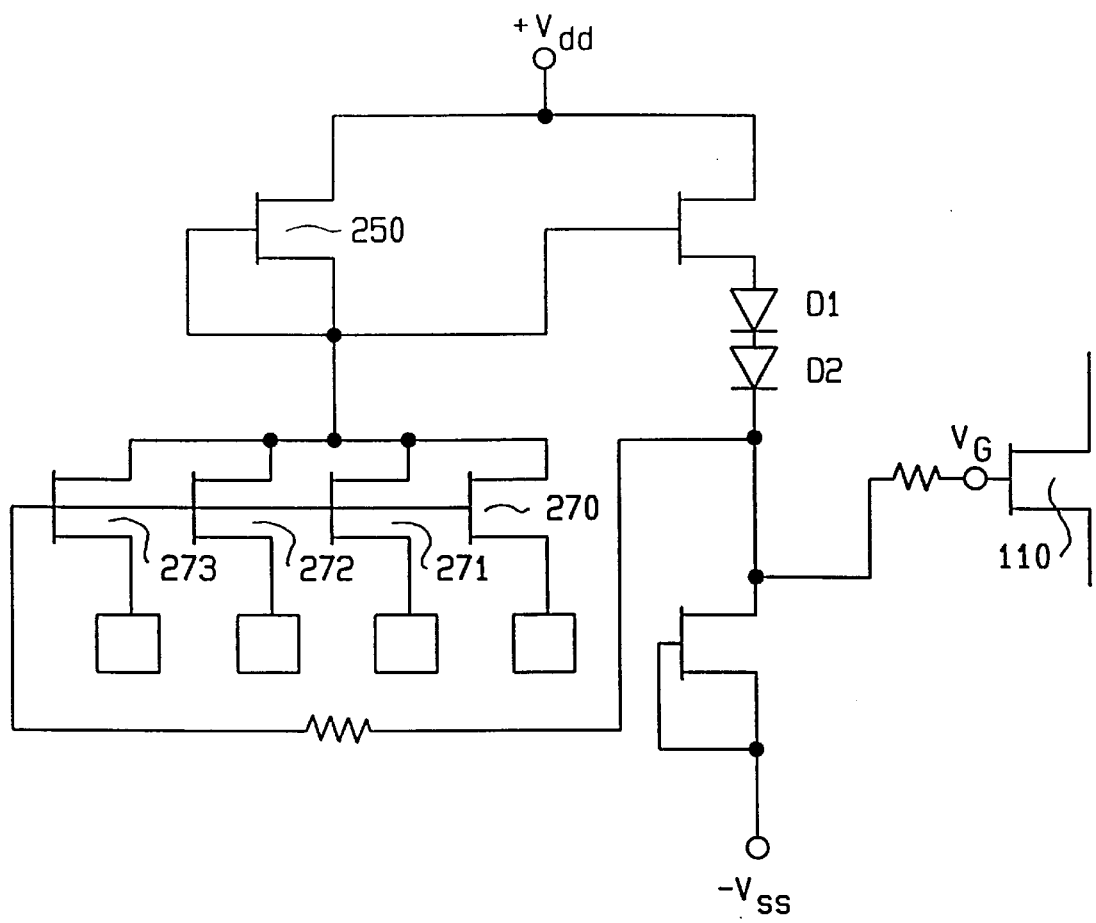
FIG. 16 is the schematic circuit diagram of another preferred embodiment of the negative voltage regulator.

In another preferred embodiment illustrated in FIG. 16, a negative voltage regulator can selectively bias FET 110 at, for example, 1, ½, ¼ or ⅛ of the zero-bias current $I_{dss}$. This is achieved by making FETs 270, 271, 272 and 273 to have gate-widths that are 1, 2, 4 and 8 times, respectively, of the gate-width of FET 250. The source terminals of FETs 270–273 are connected to respective bonding pads, which are selectively connected to ground for activating a particular FET to obtain the desired bias. For example, to bias FET 110 at an half of $I_{dss}$, the bonding pad connected to FET 271 is connected to ground. In this way, by connecting appropriate bonding pad to ground, the regulator can provide a bias that is one of a number of designed biasing voltage.

Figure 17:
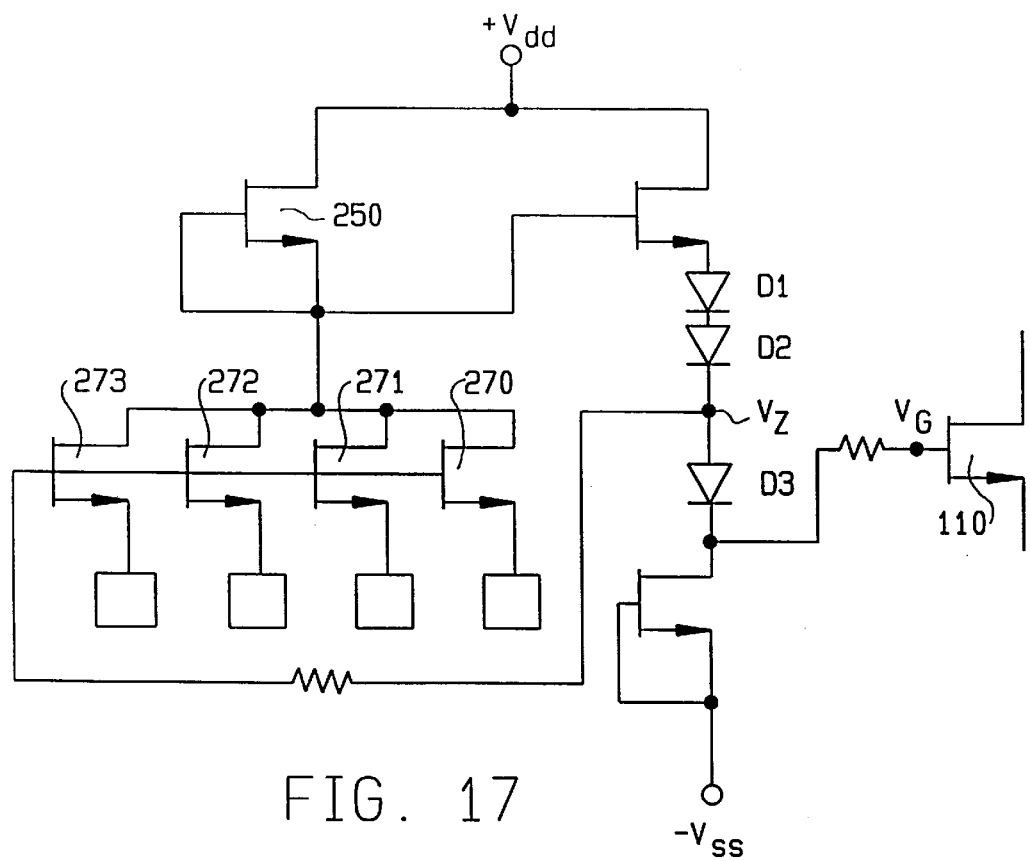
FIG. 17 is the schematic circuit diagram of an alternative embodiment of the negative voltage regulator shown in FIG. 16.

In another preferred embodiment shown in FIG. 17, a diode D3 is used to further lower bias voltage $V_Z$ by a diode voltage drop to set $V_G$ below the pinchoff voltage of FET 110 for class C operation.

Figure 18:
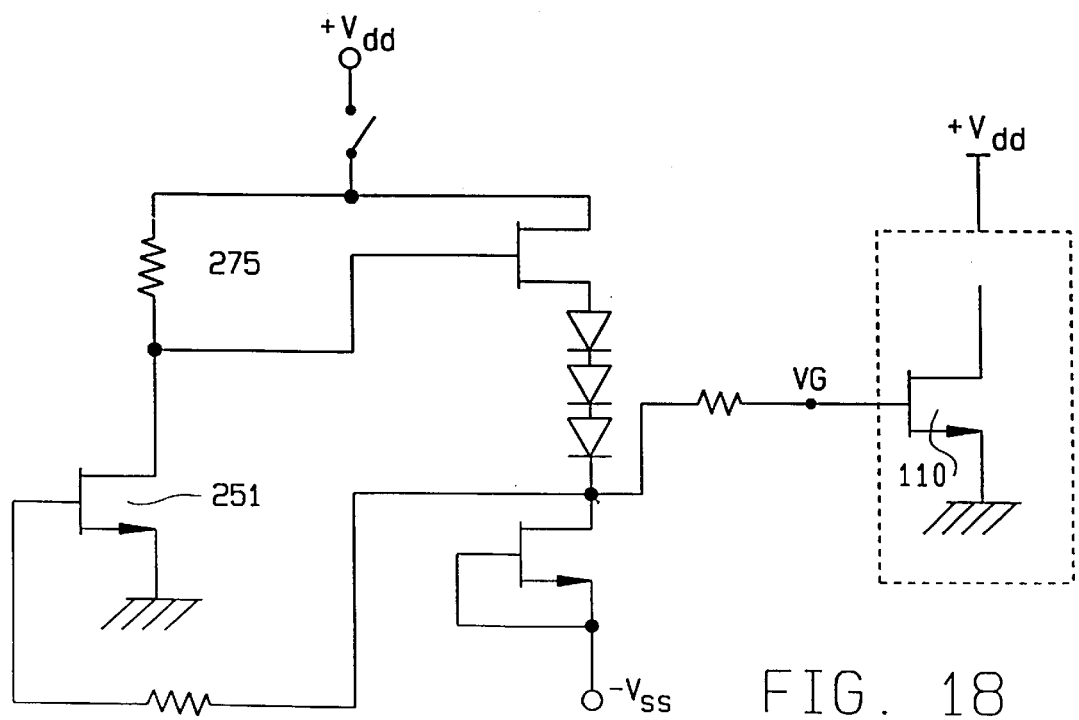
FIG. 18 is the schematic circuit diagram of an alternative embodiment of the negative voltage regulator shown in FIG. 14.

In another preferred embodiment shown in FIG. 18, a resistor 275 is used to replace FET 250 as a current source. The value of the resistor and the gate-width of FET 251 are such that a desired bias is provided to FET 110.

Figure 19:
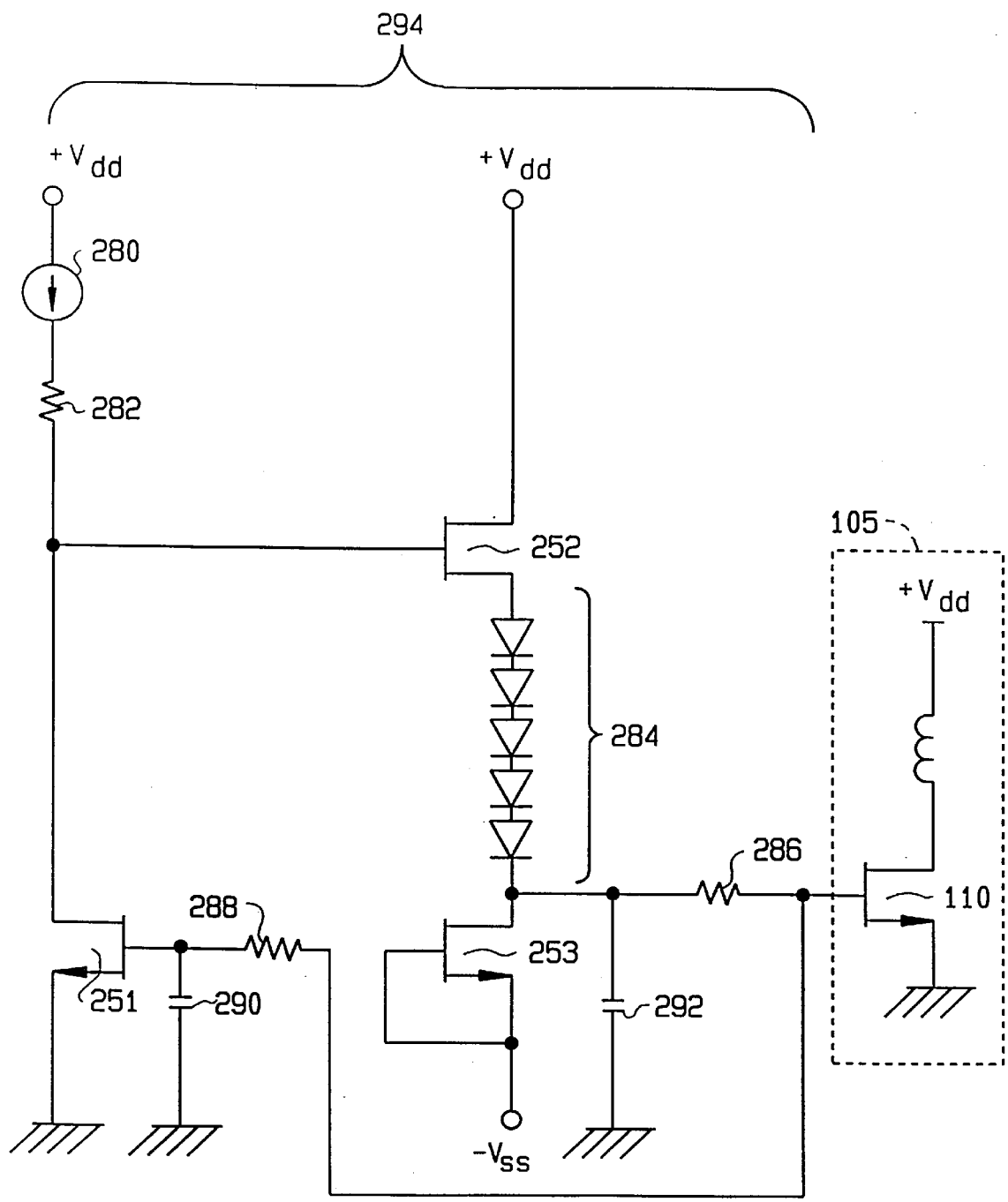
FIG. 19 is the schematic circuit diagram of yet another preferred embodiment of the negative voltage regulator with a feedback to the circuit mirror.

In yet another preferred embodiment illustrated in FIG. 19, a negative voltage regulator 294 comprises a current source 280 and depletion-mode GaAs FETs 251, 252 and 253. The current source is coupled to the drain of FET 251 through a resistor 282. FET 252 has a drain coupled to a positive terminal of a power supply $+V_{dd}$, a gate coupled to the drain of FET 251, and a source coupled to the drain of FET 253 through a series of diodes 284. The gate and source of FET 253 is connected together. The drain of FET 253 is connected to the gate of FET 110 through a resistor 286. Advantageously, the gate of FET 251 is connected to the gate of FET 110 through resistor 288. Two by-pass capacitors 290 and 292, one connected between the gate of FET 251 and the ground and the other between the gate of FET 253 and the ground are used to filter the ac signal to be amplified by FET 110.

As compared to the regulator shown in FIG. 15, this negative voltage regulator displays better temperature performance. More specifically, for the regulator shown in FIG. 15, because the current leakage through drain-gate diode of FET 110 increases with temperature, the drain current as well as the gate current of FET 110 increases with temperature. In this regulator, the gate of FET 251 is connected to the gate of FET 110 through a resistor 288 which provides feedback, which results in a reduced drain current for FET 110 and better tracking between the drain currents of FETs 110 and 251 when the temperature increases.

Figure 20:
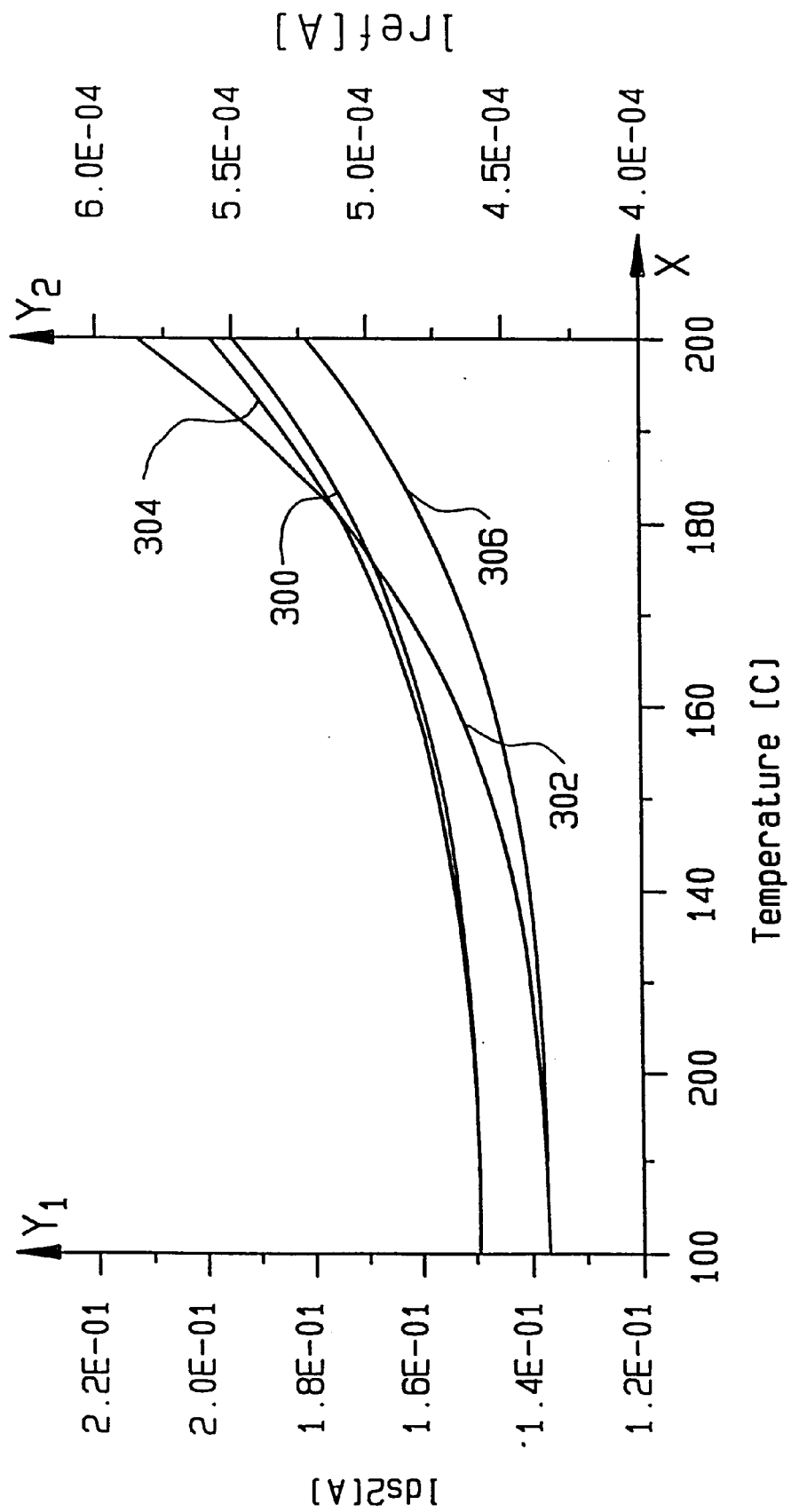
FIG. 20 depicts the simulated comparison of temperature effect between the regulators shown in FIG. 14 and FIG. 19.

FIG. 20 illustrates the comparison between drain currents of FET 110 and 251 for the regulator shown in FIG. 19, and those for the regulator shown in FIG. 15. The currents are computer-simulated. In this drawing, axis $Y_1$ and axis $Y_2$ indicate the drain current in amperes of FET 110 and FET 251, respectively, and the x-axis indicates the temperature in centigrade. The dimensions for the FETs used in the simulation is listed below.

| FET | Dimension |
|---|---|
| FET 251 | W = 150 μm, L = 0.5 μm |
| FET 110 | W = 10,000 μm, L = 0.5 μm |
| FET 252 | W = 10 μm, L = 0.5 μm |
| FET 253 | W = 10 μm, L = 0.5 μm |

In this drawing, plots 300 and 302 shows the drain current of FET 251 and 110, respectively, for the regulator shown in FIG. 15. It shows that, as the temperature increases, the drain current of FET 110 increases significantly due to the gate-drain diode leakage current and it loses track of the drain current of FET 251. For the generator shown in FIG. 19, however, the drain current of FET 110 shown by plot 306 increases less with temperature and it tracks the drain current of FET 251 depicted by plot 304 even at high temperatures. The regulator shown in FIG. 19 therefore offers better temperature performance than the one depicted in FIG. 15.

As will be apparent to those skilled in the art, numerous modifications of the present invention may be made within the scope of the invention, which is not to be limited except in accordance with the following claims.

What is claimed is:

1. A negative voltage regulator for regulating a negative voltage, comprising:
   a current source,
   a first FET having a drain coupled to said current source, a source for connection to ground, and a gate;
   a second FET having a drain coupled to said power supply, a gate coupled to the drain of said first FET, and a source;
   a third FET having a drain coupled to the source of said second FET and to the gate of said first FET, a gate and a source connected together and to said negative voltage, whereby a regulated negative voltage is provided at the drain of said third FET.

2. The negative voltage regulator of claim 1 further comprising diode means connected between the source of said second FET and the drain of said third FET.

3. A negative voltage regulator for regulating a negative voltage for biasing a depletion-mode FET, comprising:

a current source, a first FET having a drain coupled to said current source, a source coupled to ground, and a gate, a second FET having a drain coupled to a power supply, a gate coupled to the drain of said first FET, and a source, a third FET having a drain coupled to the source of said second FET, a gate and a source connected together and to said negative voltage, the drain of said third FET being resistively coupled to the gate of said depletion-mode FET, and the gate of said first FET being resistively coupled to the gate of said depletion-mode FET, whereby the effect of increased temperature on the performance of said regulator is reduced.

4. The regulator of claim 3 wherein said current source comprises a resistor coupled between said power supply and the drain of said first FET.

5. The negative voltage regulator of claim 3 wherein said first FET and said depletion-mode FET have substantially the same pinch-off characteristics, and the gate-width of said first FET is such that said negative voltage regulator provides a desired regulated negative voltage to bias said depletion-mode FET.

6. The negative voltage regulator of claim 3 wherein said current source comprises a fourth FET having a drain coupled to said power supply, a gate and a source connected together and to the drain of said first FET.

7. The negative voltage regulator of claim 6 wherein said depletion-mode FET and said first and fourth FETs have substantially the same pinch-off characteristics, and the gate-width of said first FET is a predetermined factor times the gate-width of said fourth FET, whereby said depletion mode FET is biased at substantially its characteristic zero-bias saturation current divided by said predetermined factor.

8. The negative voltage regulator of claim 7 wherein the predetermined factor is 2, whereby said depletion-mode FET is biased at substantially one half of its characteristic zero-bias saturation current for class A operation.

9. The negative voltage regulator of claim 7 wherein the predetermined factor is 4, whereby said depletion-mode FET in said amplifying stage is biased at substantially one quarter of its characteristic zero-bias saturation current for class AB operation.

10. The negative voltage regulator of claim 7 wherein the predetermined factor is such that said depletion-mode FET is biased around or below pinch-off for class B operation.

11. The negative voltage generator of claim 3 further comprising diode means connected between the source of said second FET and the drain of said third FET.

\* \* \* \* \*